United States Patent [19]

Daniel

[11] Patent Number: 5,299,204
[45] Date of Patent: Mar. 29, 1994

[54] RELIABILITY QUALIFICATION VEHICLE FOR APPLICATION SPECIFIC INTEGRATED CIRCUITS

[75] Inventor: Sabbas A. Daniel, Campbell, Calif.
[73] Assignee: VLSI Technology, Inc., San Jose, Calif.
[21] Appl. No.: 861,372
[22] Filed: Mar. 31, 1992

Related U.S. Application Data

[63] Continuation of Ser. No. 446,030, Dec. 5, 1989, abandoned.

[51] Int. Cl.$^5$ .................. G01R 31/28; H01L 27/08
[52] U.S. Cl. .................... 371/22.1; 257/203; 307/465.1
[58] Field of Search .......... 371/15.1, 22.1, 22.2, 371/22.3, 22.5; 307/269, 465.1; 257/203

[56] References Cited

U.S. PATENT DOCUMENTS

| | | | |
|---|---|---|---|
| 3,921,142 | 11/1975 | Bryant et al. | 371/21.2 X |
| 4,458,165 | 7/1984 | Jackson | 307/395 |
| 4,593,205 | 6/1986 | Bass et al. | 307/269 |
| 4,688,072 | 8/1987 | Heath et al. | 357/45 |
| 4,724,531 | 2/1988 | Angleton et al. | 365/189 |
| 4,733,288 | 3/1988 | Sato | 257/203 X |
| 4,864,381 | 9/1989 | Seefeldt et al. | 357/45 |
| 4,931,722 | 6/1990 | Stoica | 371/22.5 |
| 4,949,341 | 8/1990 | Lopez et al. | 371/25.1 |

OTHER PUBLICATIONS

Sechenr, C. et al., "The Timberwolf Placement and Routing Package", *IEEE J. Solid-State Circuits*, vol. SC-20, No. 2, Apr. 1985, pp. 510–522.

Baran, D. et al., "HC2000: A Fast Gate Array with Built-In Self Test and System Fault Isolation . . . ", *IEEE Custom IC Conf.*, May 1986, pp. 315–318.

Rasmussen, R. et al., "Advanced Testing Techniques for Structured ASIC Products", *IEEE Custom IC Conf.*, May 1986, pp. 412–415.

"Functional cells support 16-bit CPU to create alterable microcomputer", by H. Lyle Supp, American Microsystems, Inc., a subsidiary of Gould, Inc., Santa, Clara, Calif., *Electronics*, Sep. 22, 1982, pp. 151–153.

"Pseudo-Exhaustive Adjacency Testing: A BIST Approach for Stuck-Open Faults," by Gary L. Craig and Charles R. Kime, Dept. of Electrical and Computer Eng. Univ. of Wisconsin-Madison, paper 3.6, *1985 Int'l Test Conference*, 126–137.

"LOCST: A Built-In Self-Test Technique" by Johnny J. LeBlanc, IBM Federal Systems Division, *IEEE Design & Test*, Nov. 1984, pp. 45–52.

"Testing for MOS IC Failure Modes" by David G. Edwards, Senior Member IEEE, Siemens Corporation, Cherry Hill, *IEEE Transactions on Reliability*, vol. R-31, No. 1, Apr. 1982, pp. 9–17.

"Fundamentals of Testability—A Tutorial" by Ronald R. Fritzemeier, Member, IEEE, H. Troy Nagle, Fellow, IEEE, and Charles F. Hawkins, Member, IEEE, *IEEE Transactions on Industrial Electronics*, vol. 36, No. 2, May 1989, pp. 117–128.

"Microprocessor Testability" by H. Troy Nagle, Fellow, IEEE, Ronald R. Fritzemeier, Member, IEEE, Jean E. Van Well & Michael G. McNamer, *IEEE Transactions on Industrial Electronics*, vol. 36, No. 2 May 1989, pp. 151–163.

"Reconfigurable Hardware for Pseudo-Exhaustive Test", by Jon G. Udell Jr., Ctr. for Reliable Computing Depts. of Electrical Eng. and Computer Science—Stanford University, *1988 Int'l Test Conference*, Paper 27.3, PP. 522–530.

*Primary Examiner*—Stephen M. Baker
*Attorney, Agent, or Firm*—Majestic, Parsons, Siebert & Hsue

[57] ABSTRACT

Reliability qualification vehicles are described with internally generated clock and control signals which may be selected in place of externally generated signals for exercising the vehicle. If implemented in gate-arrays, the vehicle may be contained in different sized packages to test the effects of different size packaging on the vehicle. Substantially all the gates of the vehicle are testable. The vehicle may be operated synchronously and its design enables quick feedback and analysis of faulty portions of a cell library or place and route scheme.

4 Claims, 31 Drawing Sheets

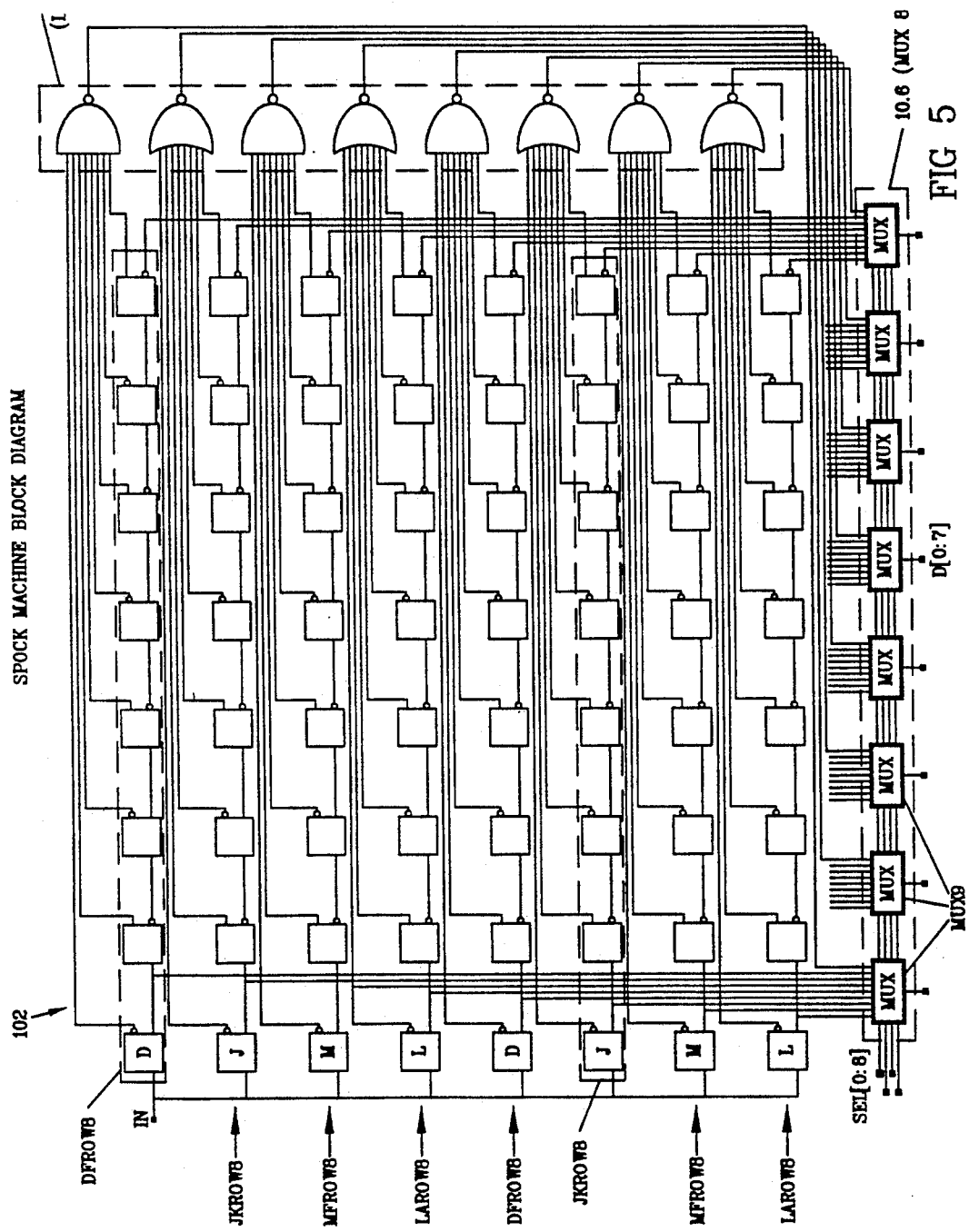

RELIABILITY QUALIFICATION VEHICLE FOR APPLICATION SPECIFIC INTEGRATED CIRCUITS

This is a continuation of application Ser. No. 446,030, filed Dec. 5, 1989, now abandoned.

BACKGROUND OF THE INVENTION

This application relates in general to devices for testing the reliability of integrated circuits and in particular to a reliability qualification vehicle in the application specific integrated circuit (ASIC) industry to qualify a given technology, process and/or design system and packaging.

In the ASIC industry, while some ASIC manufacturers have manufactured integrated circuit chips designed for particular purposes of customers, the preferred approach by many ASIC manufacturers is to provide design tools which enable customers to design their own integrated circuit chips. Such an approach takes advantage of the intimate knowledge customers have of their requirement so that the chips designed would fit the customer's requirements more closely.

The design tools provided by VLSI Technology, Inc. of San Jose, Calif., for example, include cell libraries and place and route systems. The cell library would include building blocks such as flip-flops, registers, logic gates, multiplexers and counters. At least two place and route systems are offered for placing the cells in a semiconductor medium such as silicon and for interconnecting the portions of the cells according to customer design to form the desired integrated circuit chip. In one place and route system known as the standard-cell approach, the design of each cell in the library is optimized to reduce the areas of semiconductor medium required and to increase the speed and power performance. For this reason different cells in the library would usually differ in their diffusion, oxide and polysilicon layers. In the second approach known as gate-arrays, all the cells in the library will have the same oxide, diffusion, polysilicon and other layers, where the layers are substantially planar sheets uniformly distributed in the semiconductor medium. The cells in the library of the gate-array approach differ only in the way different portions of the layers are connected, usually through metal interconnects.

The gate-array approach is used usually when area economy in silicon, as well as power and heat dissipation considerations are not paramount, such as when testing the internal consistency and feasibility of a particular crude design. At a preliminary stage of design, the primary concern is frequently merely the feasibility of the design. After the design proves to be practical, the design can be further improved in accordance with power and economy in area considerations. The gate-array approach is therefore frequently used in the preliminary design stage. After feasibility is proven, the standard-cell approach may be adopted for an improved design.

In both approaches, the design tools provided by ASIC manufacturers permit a customer to enter a schematic into a computer by entering the icons for the cells in a particular library. In both the standard-cell and the gate-array approaches, the computer would then fetch the particular layout of the cells so entered. After the customer or user enters the interconnections between the cells, a predetermined place and route system is then employed to connect the appropriate portions of the layers in the cells to be connected to provide a complete layout of all the different layers in the semiconductor medium and layout of the metal interconnections between the layers to yield a complete chip layout that accurately reflects customer design.

After an integrated circuit chip has been fabricated, it is necessary to test the reliability of the chip to assure that it is durable and would not fail during usage. To this date, no device has been expressly designed for qualifying the reliability of ASIC chips. Therefore, in order to test the reliability of a particular ASIC chip, the fabricated chip is tested in order to compile failure rate statistics. However, it is inherent in the nature of the ASIC design process that each chip designed using ASIC tools would differ from any other ASIC chip designed using the same ASIC tools. Hence every design would have to be qualified in manufacturing which is impractical since this would entail thousands of separate qualifications. It is therefore desirable to provide a device expressly dedicated for testing and analysis, and for the compilation of failure rate statistics that will qualify substantially all devices manufactured using a particular ASIC design system, process, technology and packaging.

SUMMARY OF THE INVENTION

This invention is directed towards a reliability qualification vehicle for use with an application specific integrated circuit design system, where the system includes a design library of cells and a place and route scheme to enable integrated circuits to be designed from these cells using the place and route scheme. The vehicle comprises a first integrated circuit employing at least some cells from the library and using the place and route scheme so that reliability testing and analysis of the integrated circuit will indicate the reliability of other integrated circuits designed using at least some of the cells and employing the same place and route scheme.

In the preferred embodiment, the integrated circuit includes means for generating an internal clock signal for operating the circuit during reliability testing so that no external vectors are required to exercise the device. The preferred embodiment employs the types of cells in such numbers as a typical customer design, taking into consideration the technological complexity (e.g., interconnect routing), design tools used, power dissipation, and maximum operating frequency. The size of the chip may be varied by including one or more of the circuits for testing the reliability of different size packages. The circuit is designed such that every node of the circuit can be tested and analyzed so that 100% of the chip is exercisable. Finally, the preferred embodiment is designed so that faulty cells and the faulty nodes in such cells can be easily identified during testing and analysis.

Figure 4:
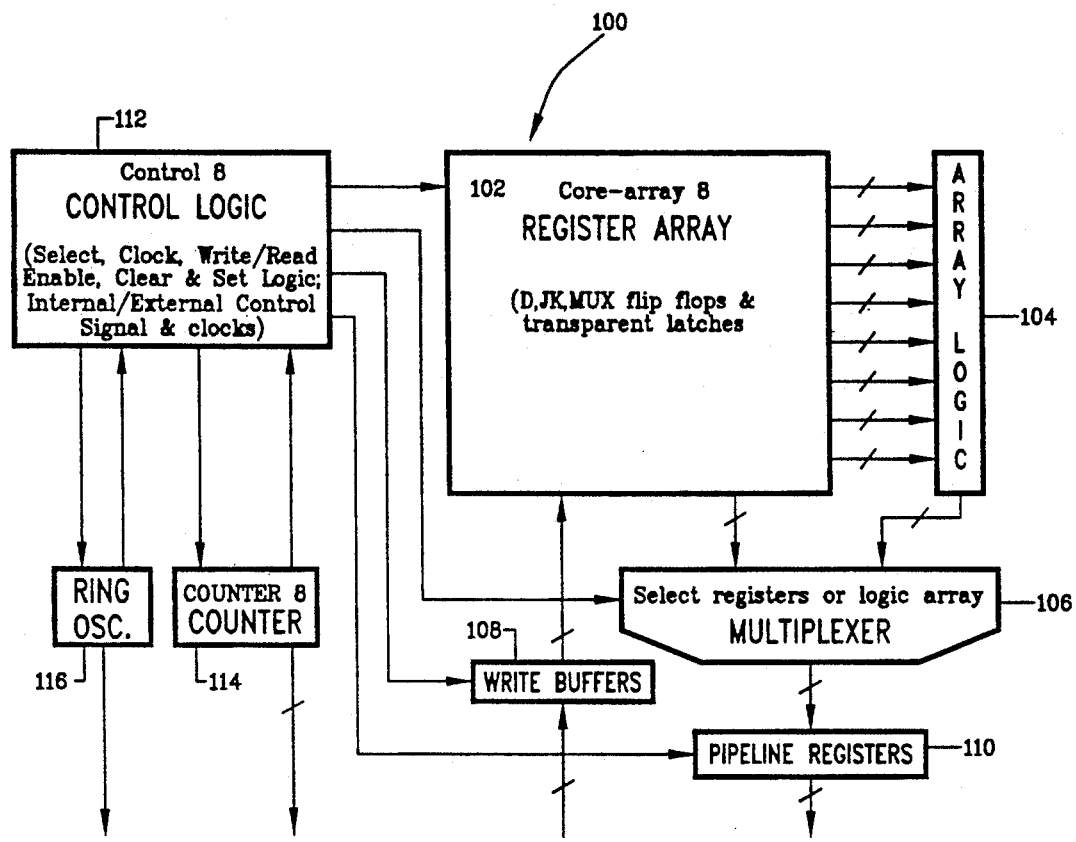
FIG. 4 is a block diagram of a portion of a reliability qualification vehicle common to the vehicles of FIGS. 1 and 2 to illustrate the preferred embodiment of the invention.

FIG. 5 is a schematic circuit diagram of the register array 102, array logic 104 and multiplexer 106 of the circuit of FIG. 4 to illustrate the preferred embodiment of the invention.

Figure 6A:
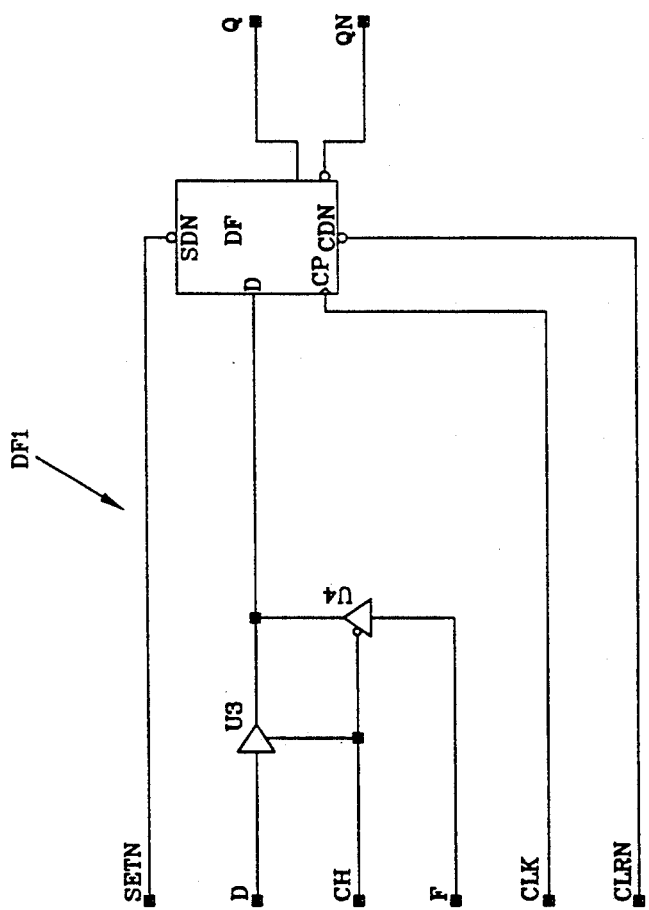
Figure 6B:
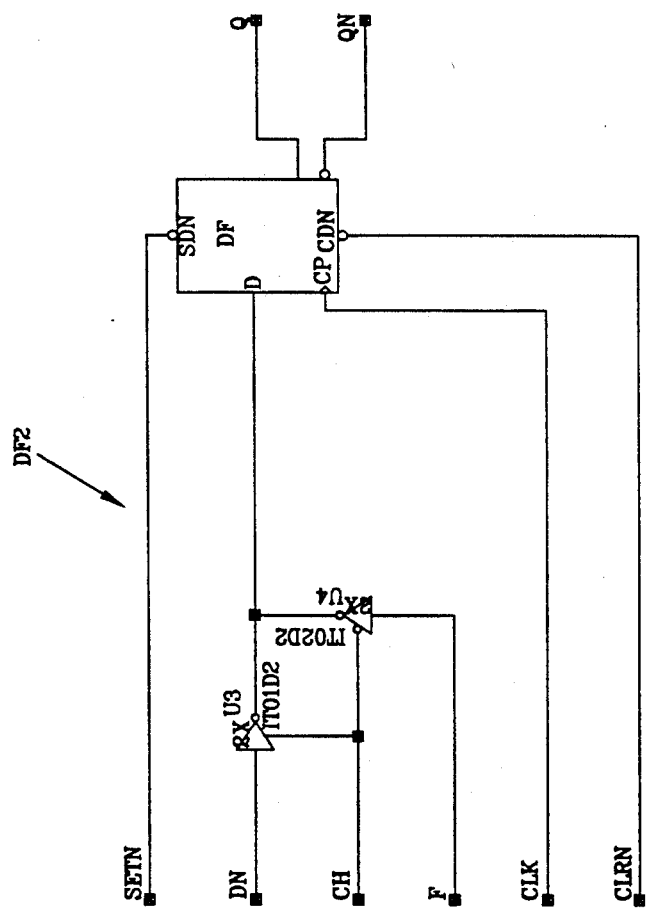

FIGS. 6A, 6B are two different D flip-flops DF1, DF2 used in register array 102 to illustrate the structure of register array 102.

Figure 6C:
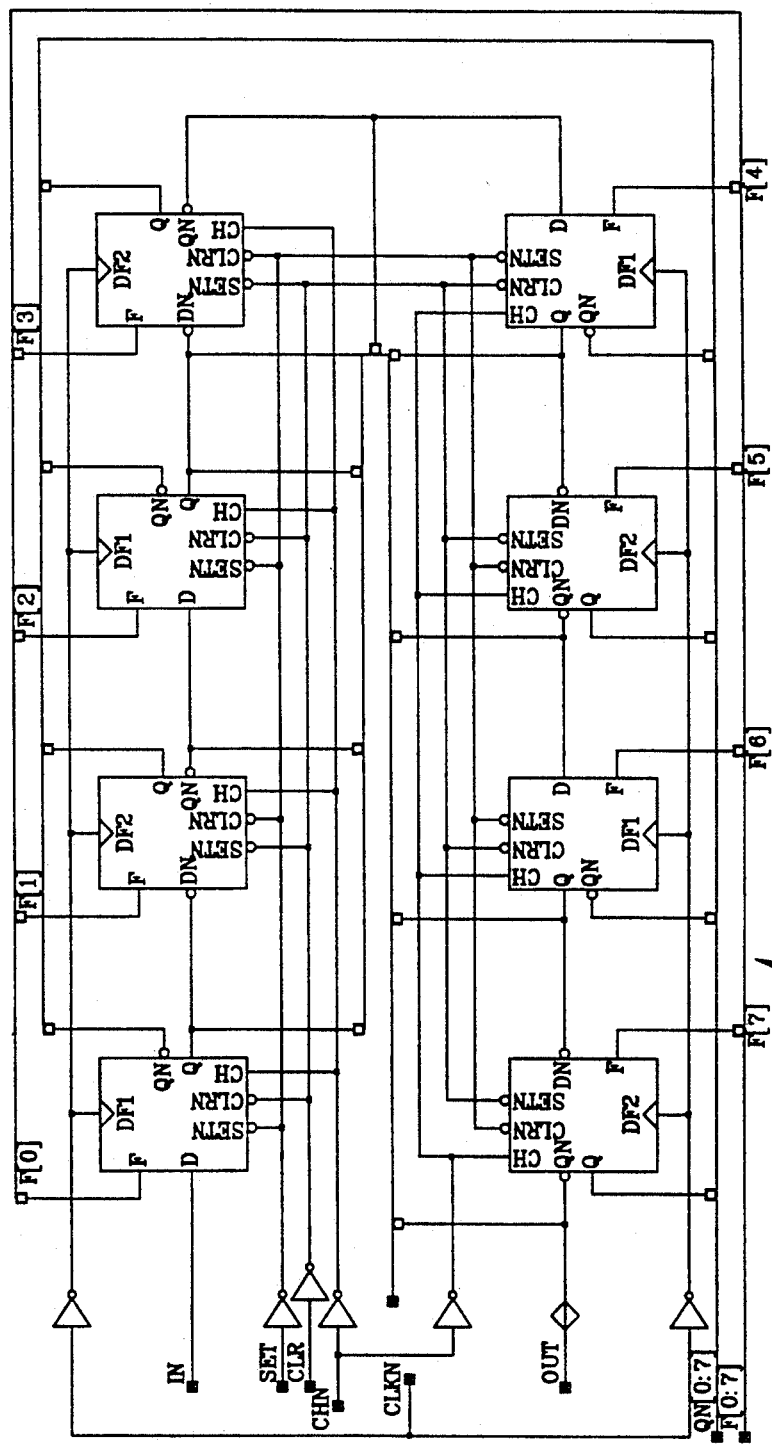

FIG. 6C is a schematic circuit diagram of one of the rows of flip-flops in register array 102, where each row includes four DF1 and four DF2 type flip-flops.

Figure 7A:
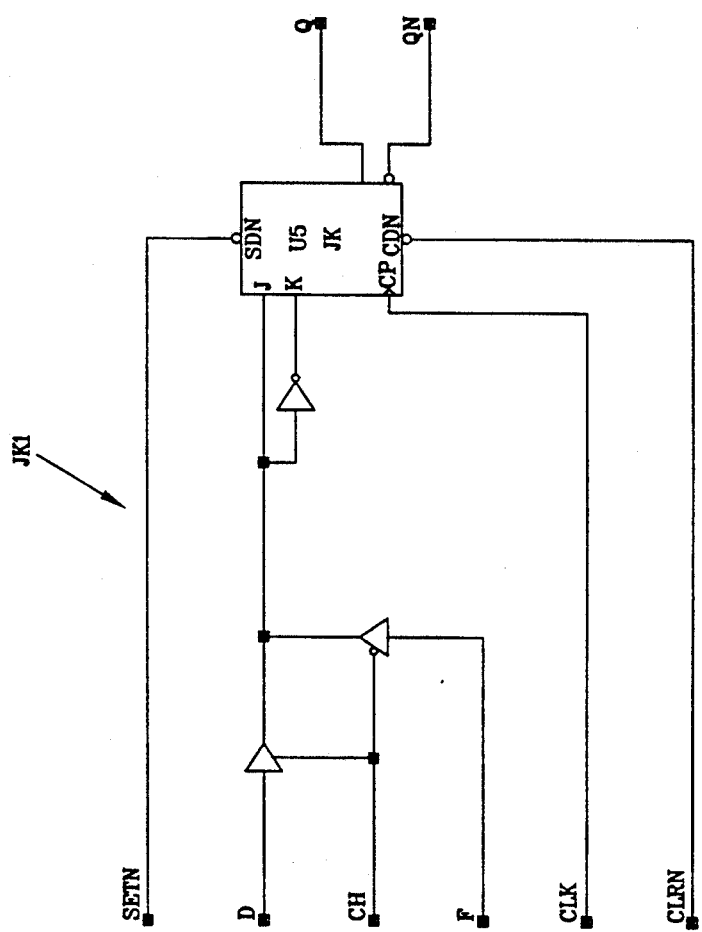
Figure 7B:
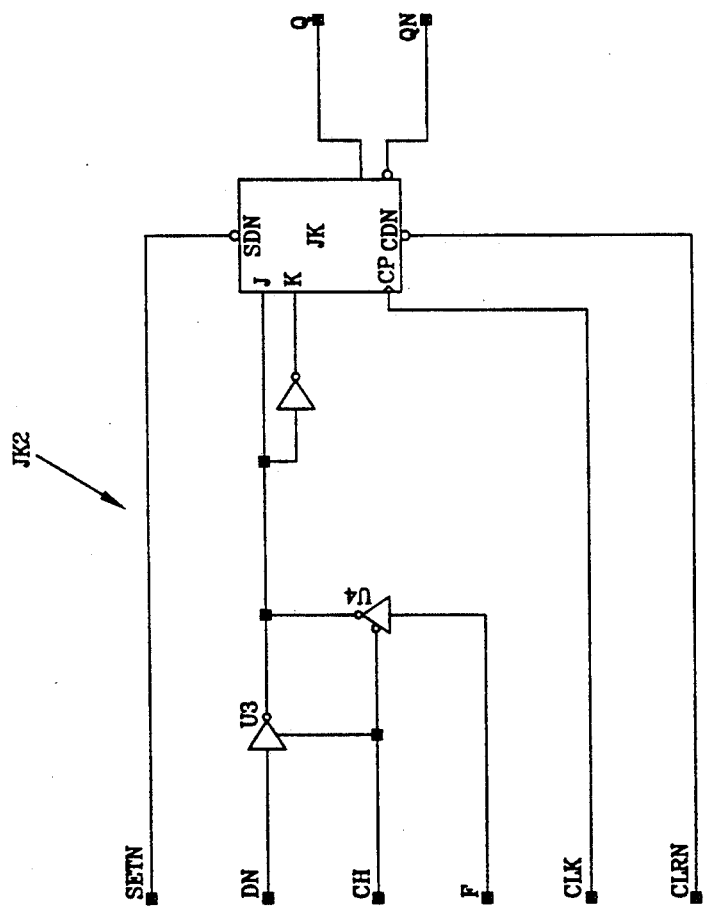
Figure 7C:
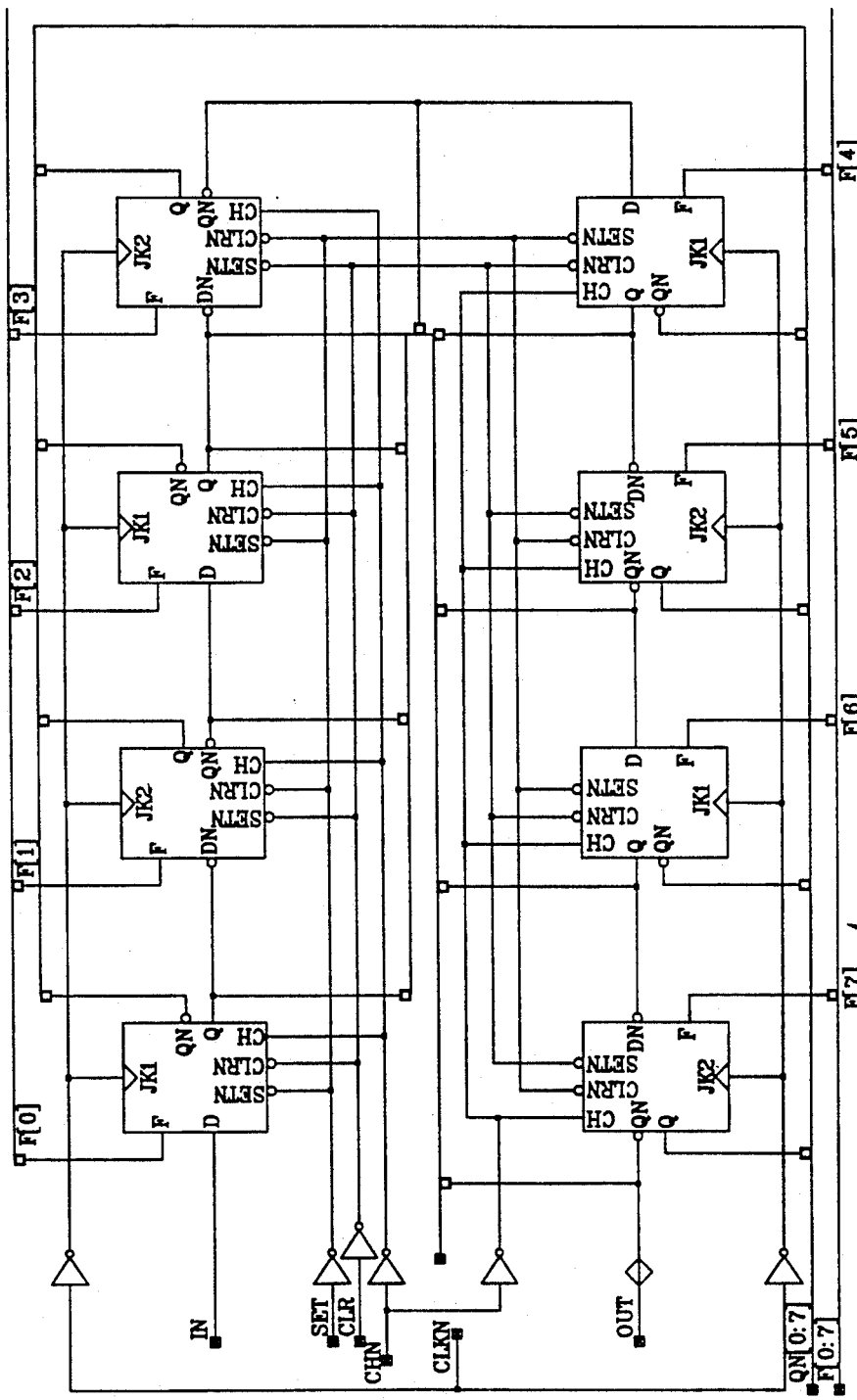

FIGS. 7A-7C are schematic circuit diagrams of two different JK flip-flops JK1, JK2 and a row of four JK1 and four JK2 flip-flops to illustrate the structure of array 102.

Figure 8A:
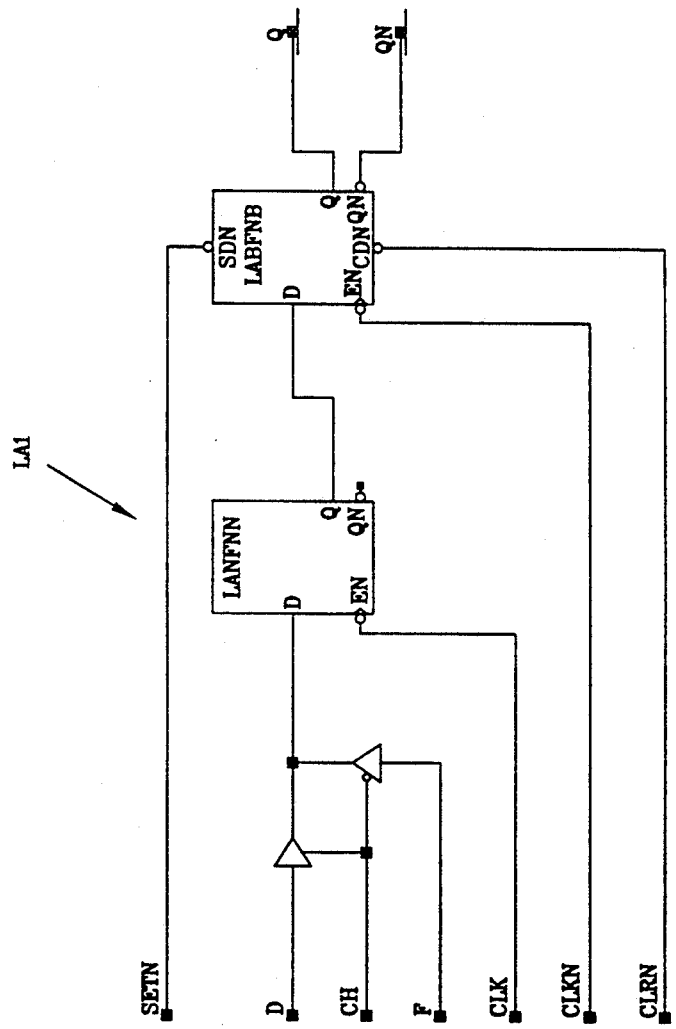
Figure 8B:
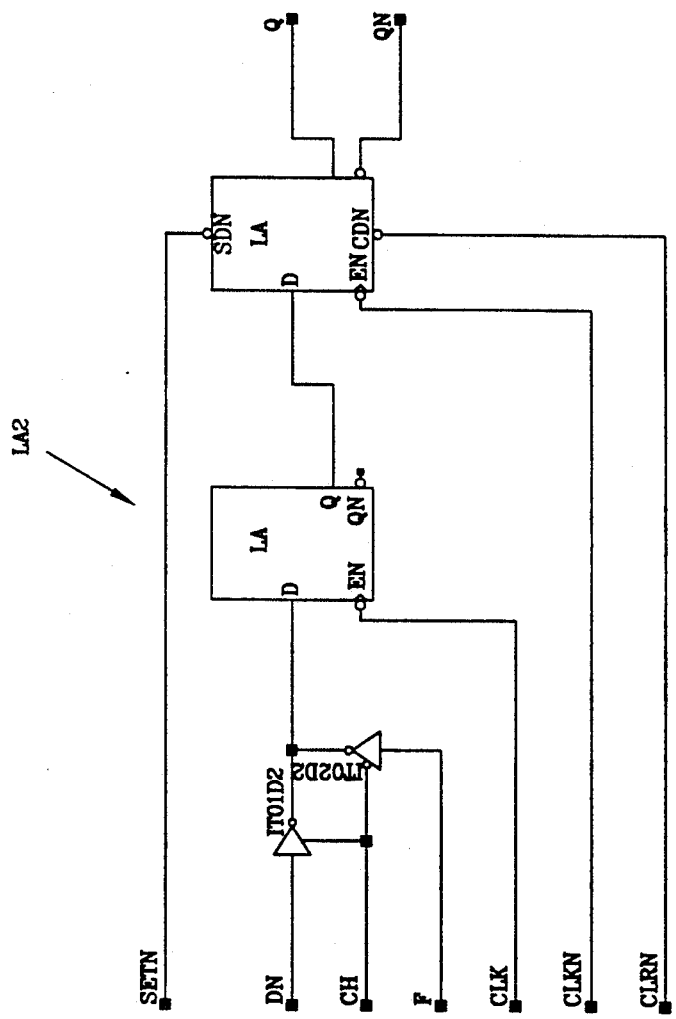
Figure 8C:
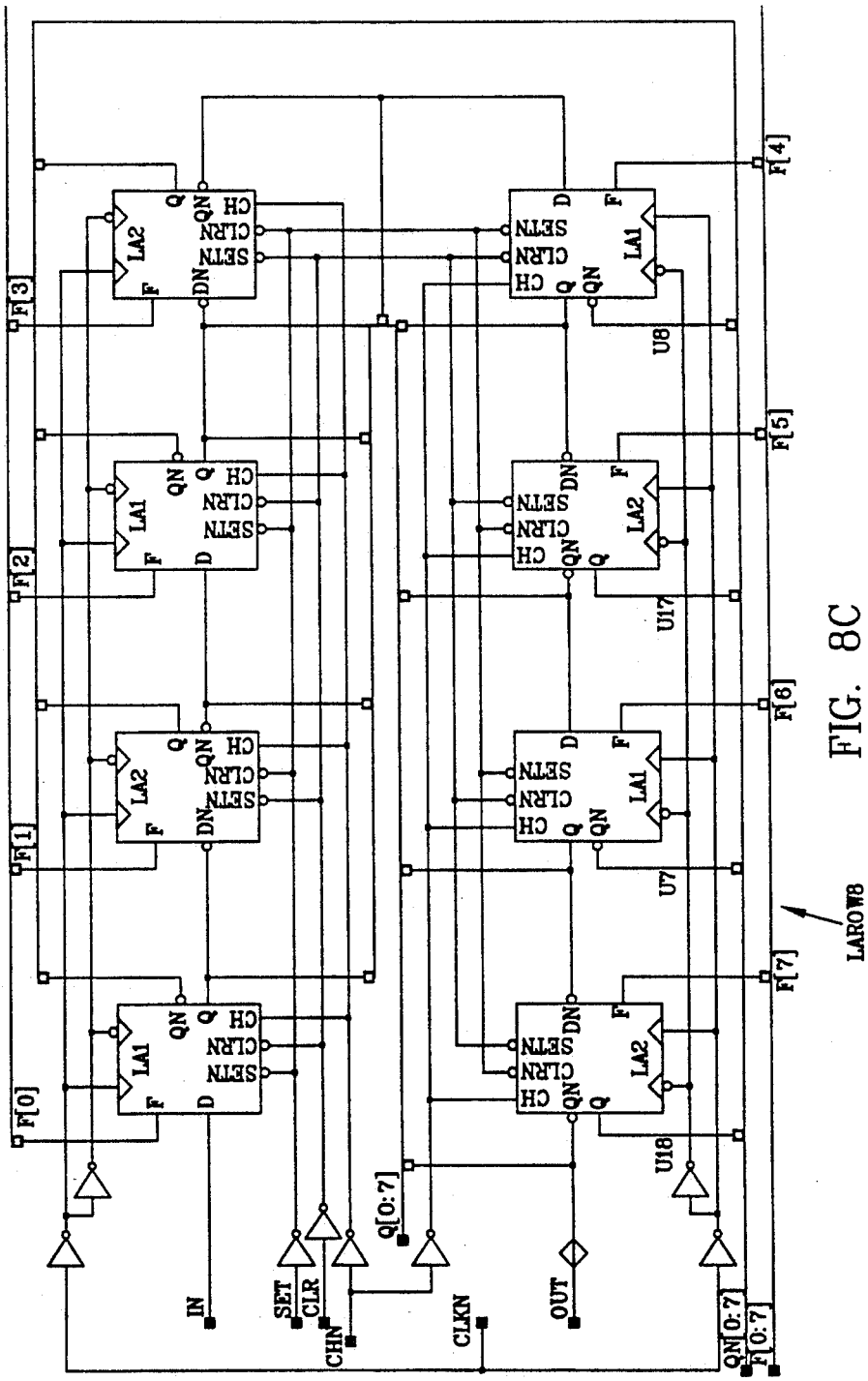

FIGS. 8A-8B are schematic circuit diagrams of two types of latch cells LA1, LA2 and a row of four LA1 and four LA2 type latches to illustrate the structure of array 102.

Figure 9A:
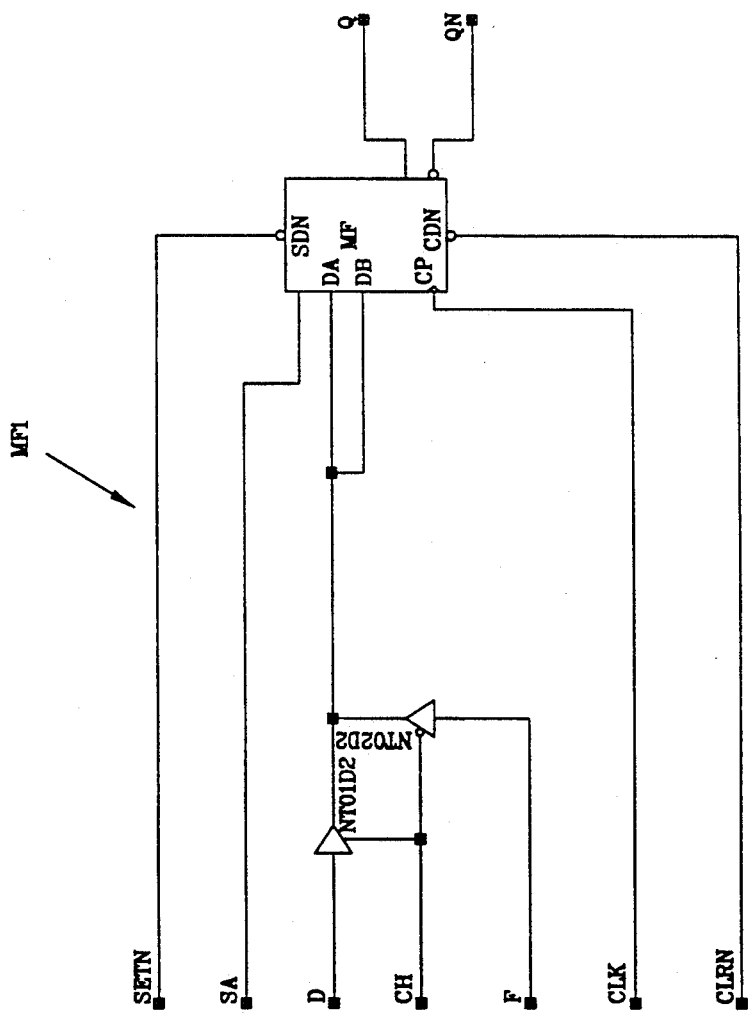
Figure 9B:
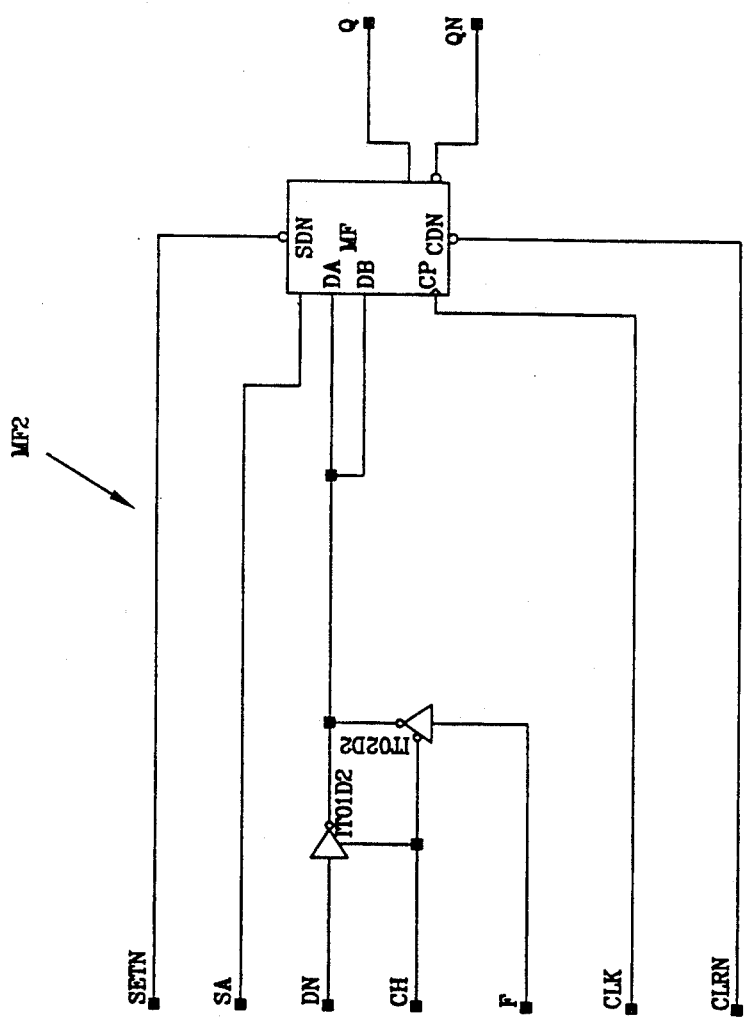
Figure 9C:
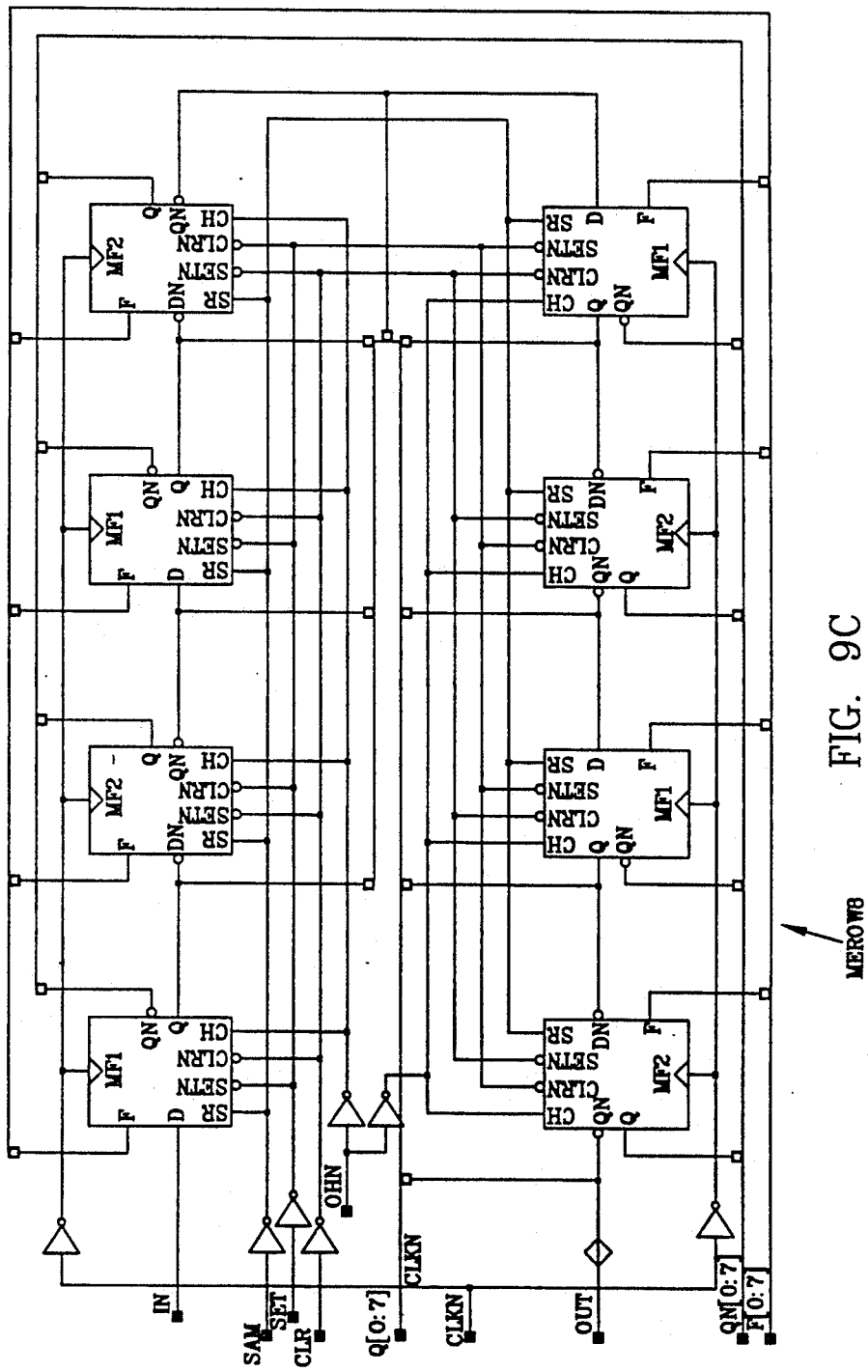

FIGS. 9A-9C are schematic circuit diagrams of two types of MF flip-flops MF1, MF2 and a row of four MF1 and four MF2 flip-flops to illustrate in detail the structure of array 102.

Figure 10A:
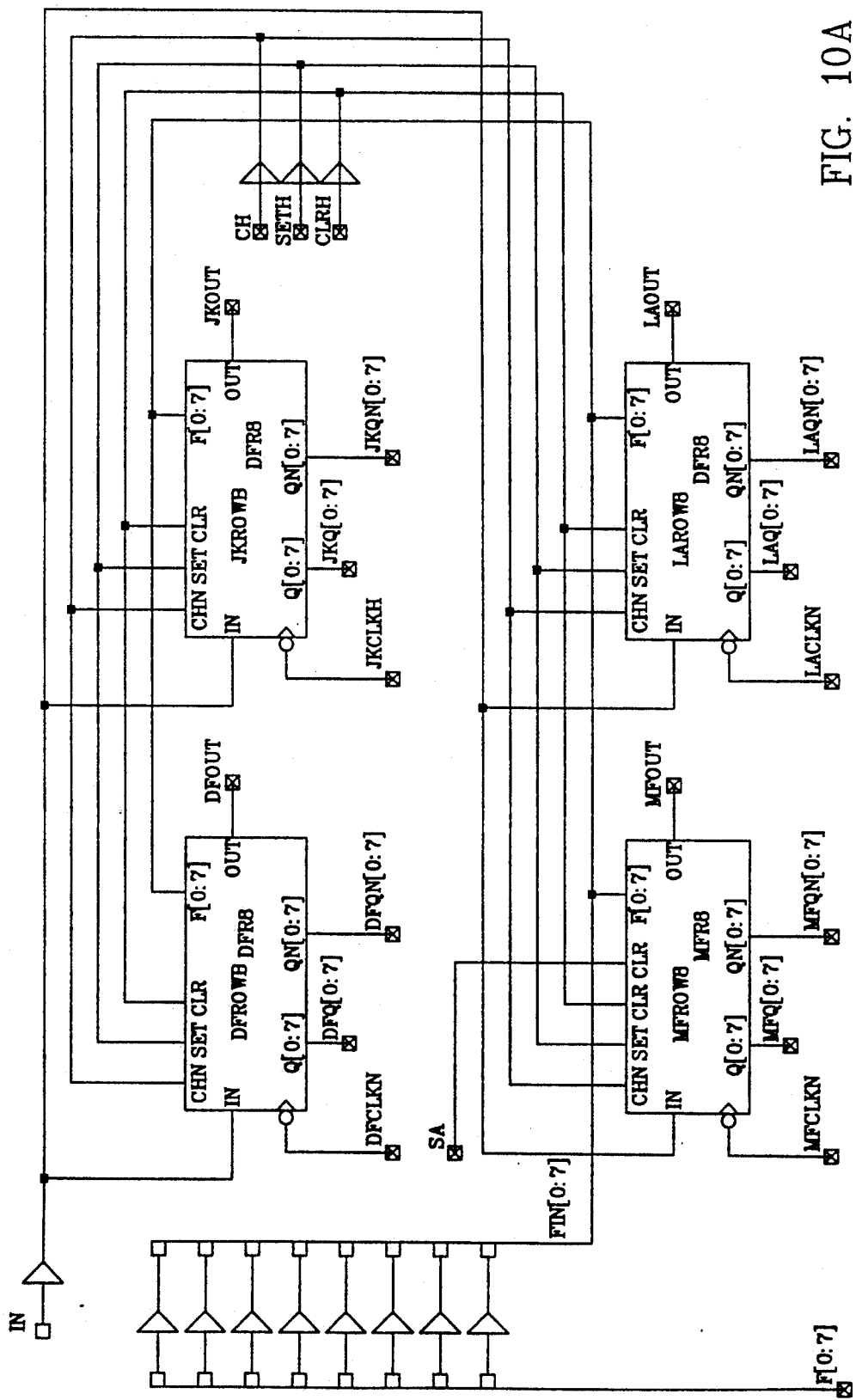
Figure 10B:
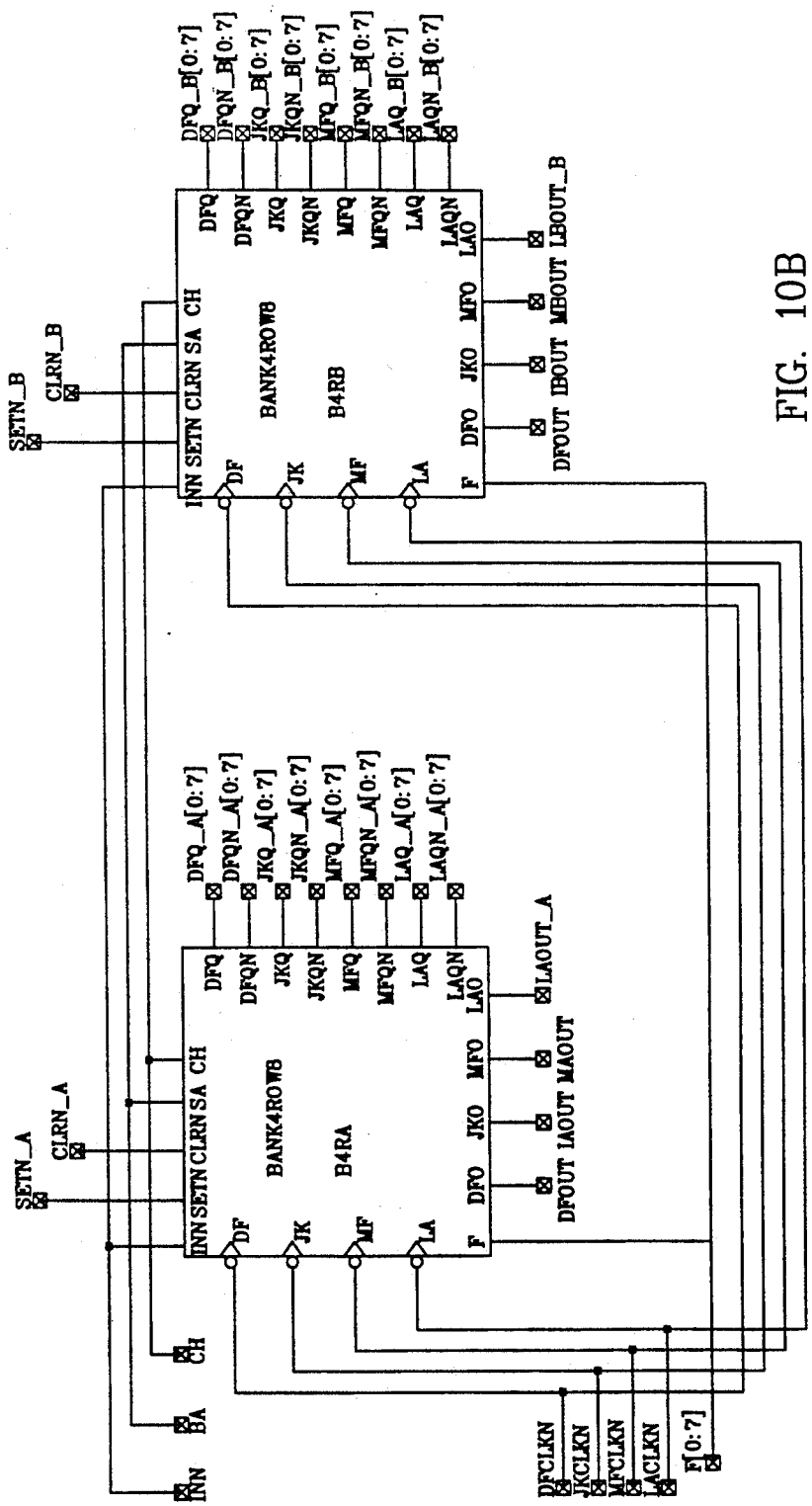

FIGS. 10A, 10B are block diagrams illustrating the structure of array 102.

Figure 11A:
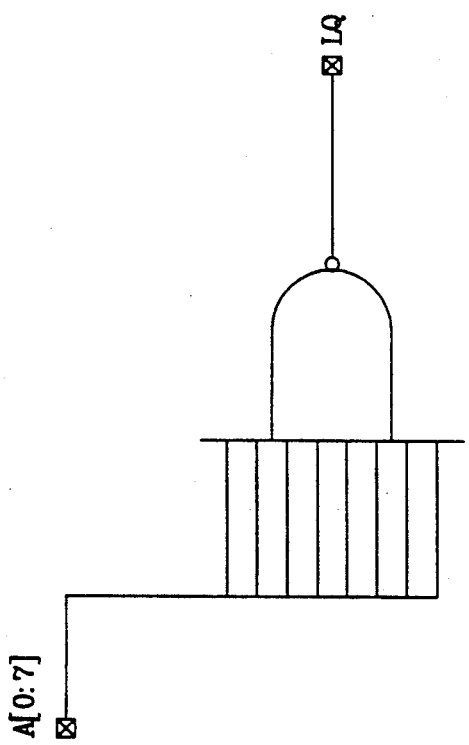
Figure 11B:
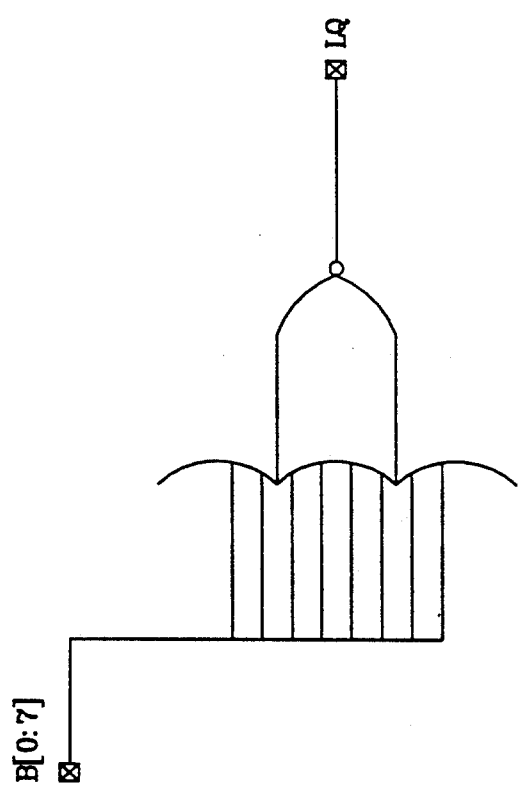
Figure 11C:
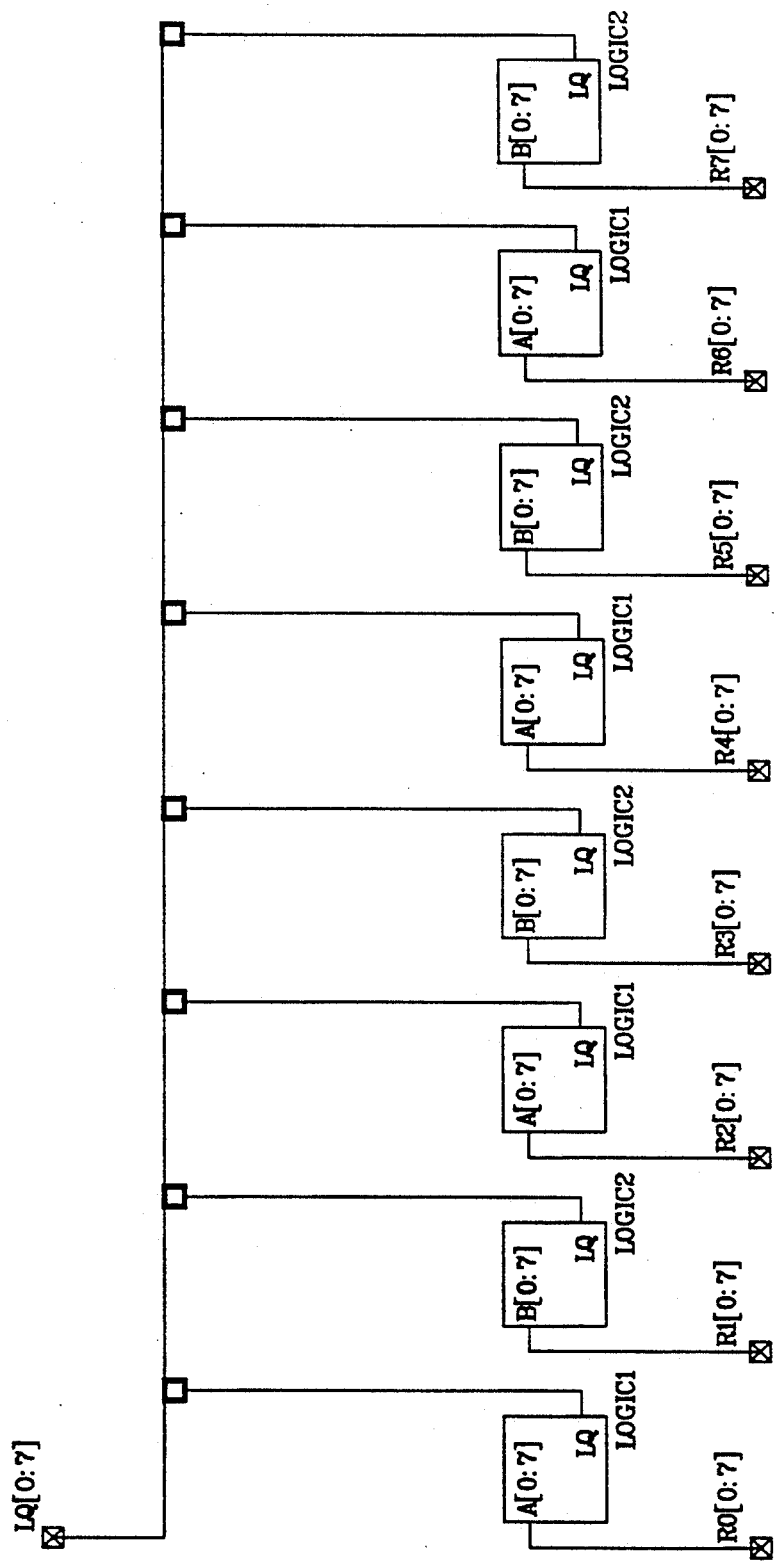

FIGS. 11A-11C are schematic circuit diagrams to illustrate array logic 104 of FIG. 4.

Figure 12A:
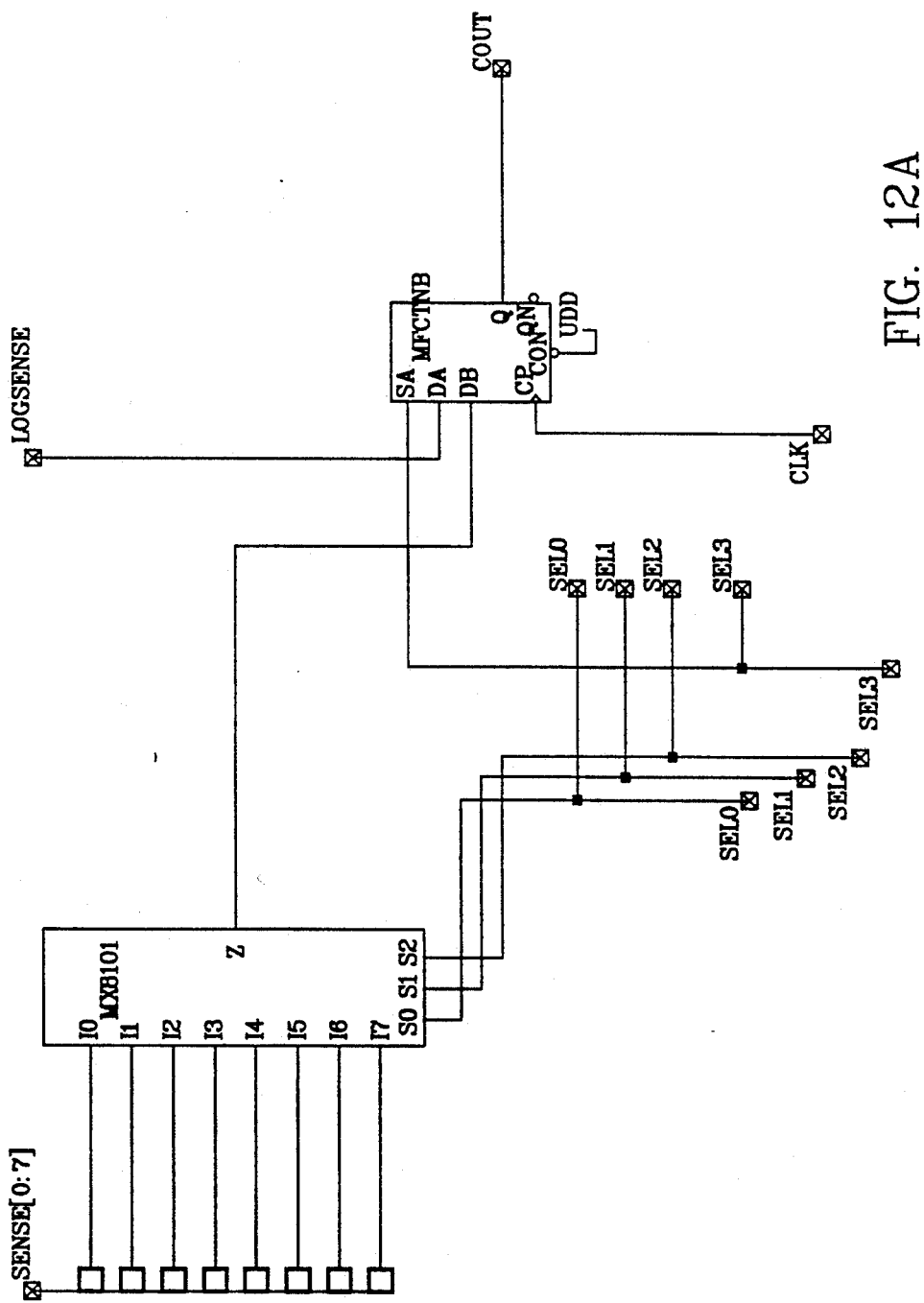
Figure 12B:
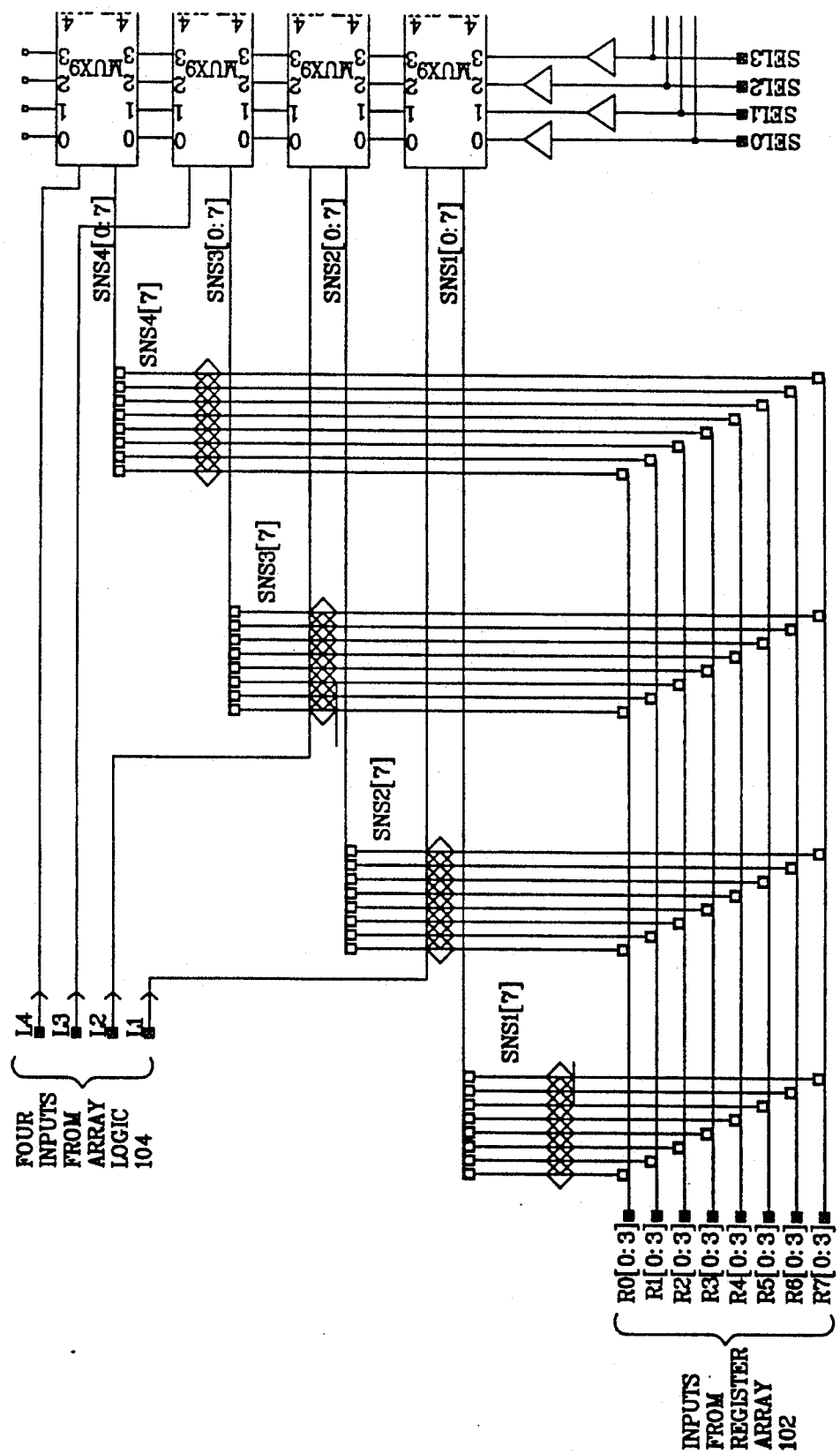
Figure 12C:
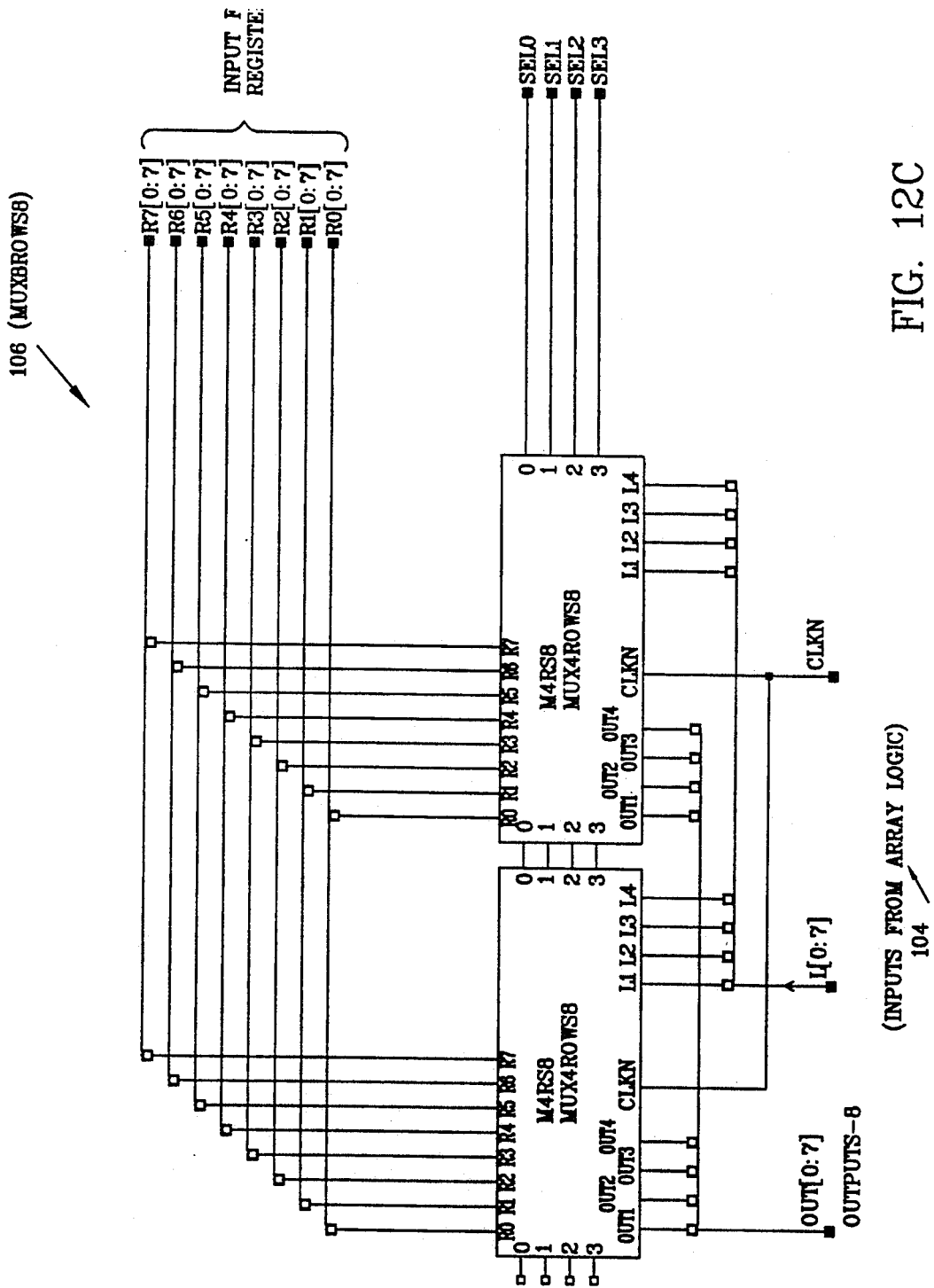

FIGS. 12A-12C are schematic and block diagrams illustrating in more detail the structure of multiplexer 106 of FIG. 4.

Figure 13:
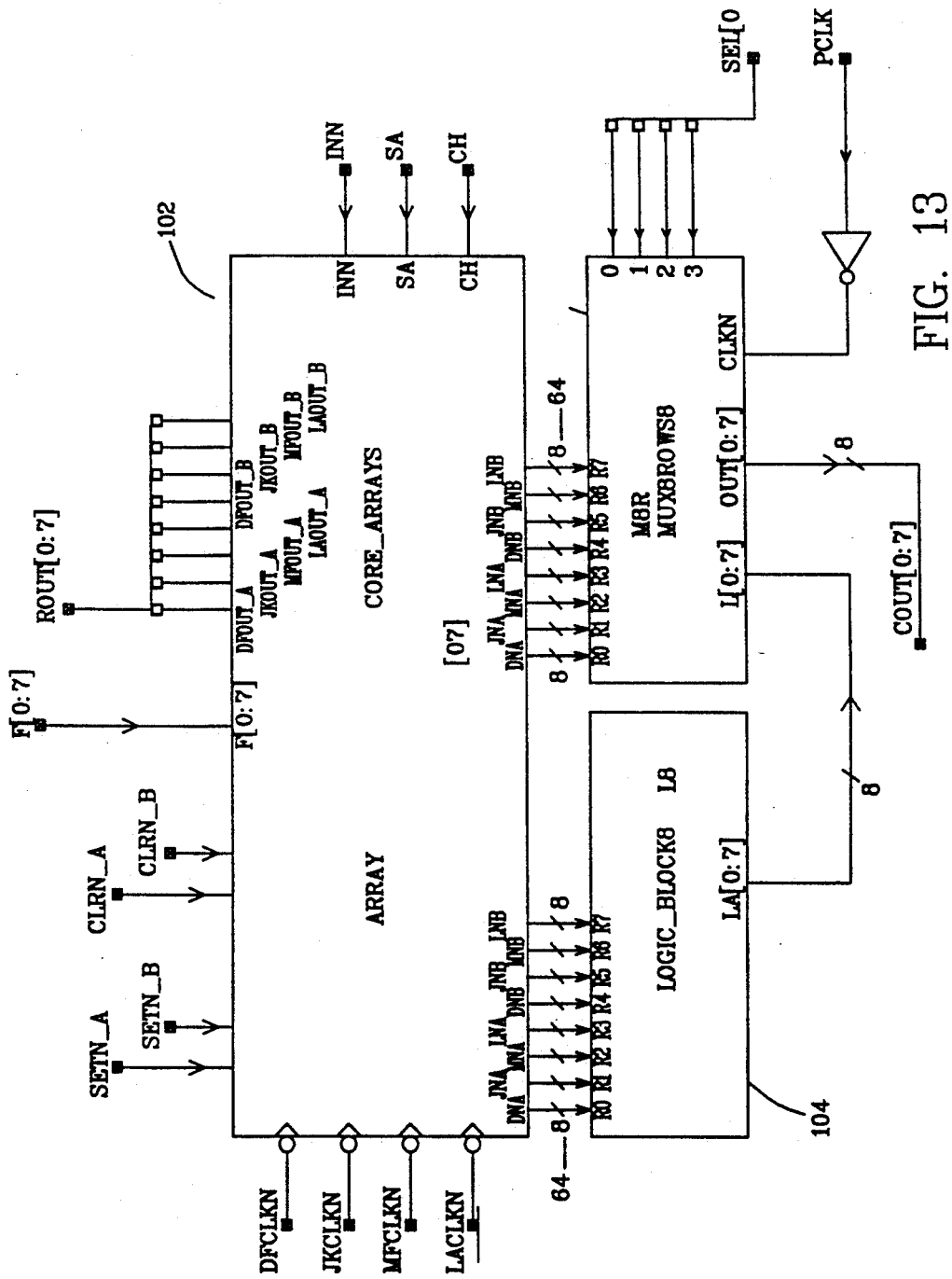

FIG. 13 is a block diagram illustrating in more detail array 102, array logic 104, multiplexer 106 and the connections between the elements.

Figure 14:
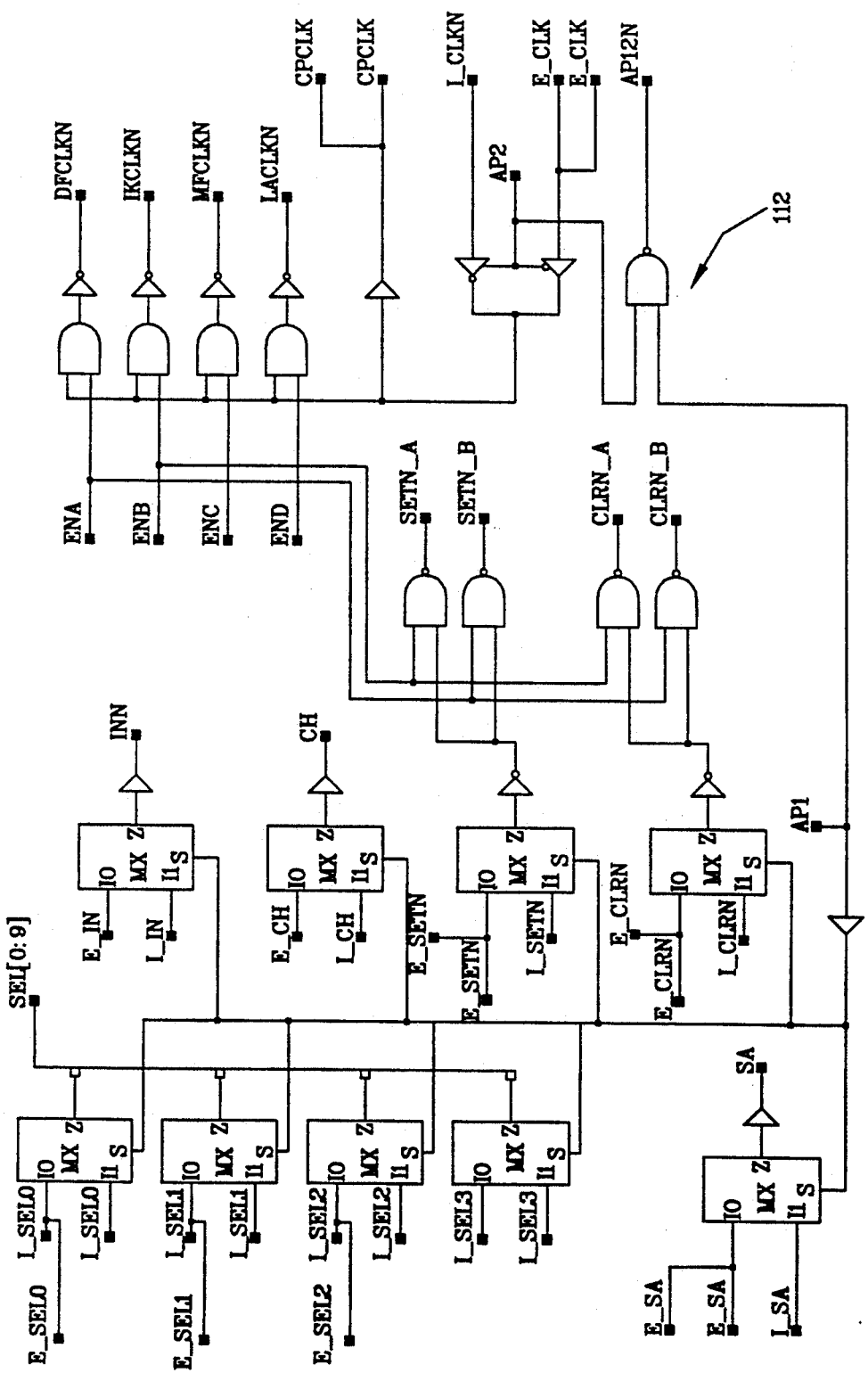

FIG. 14 is a schematic circuit diagram of control logic 112 of FIG. 4.

Figure 15:
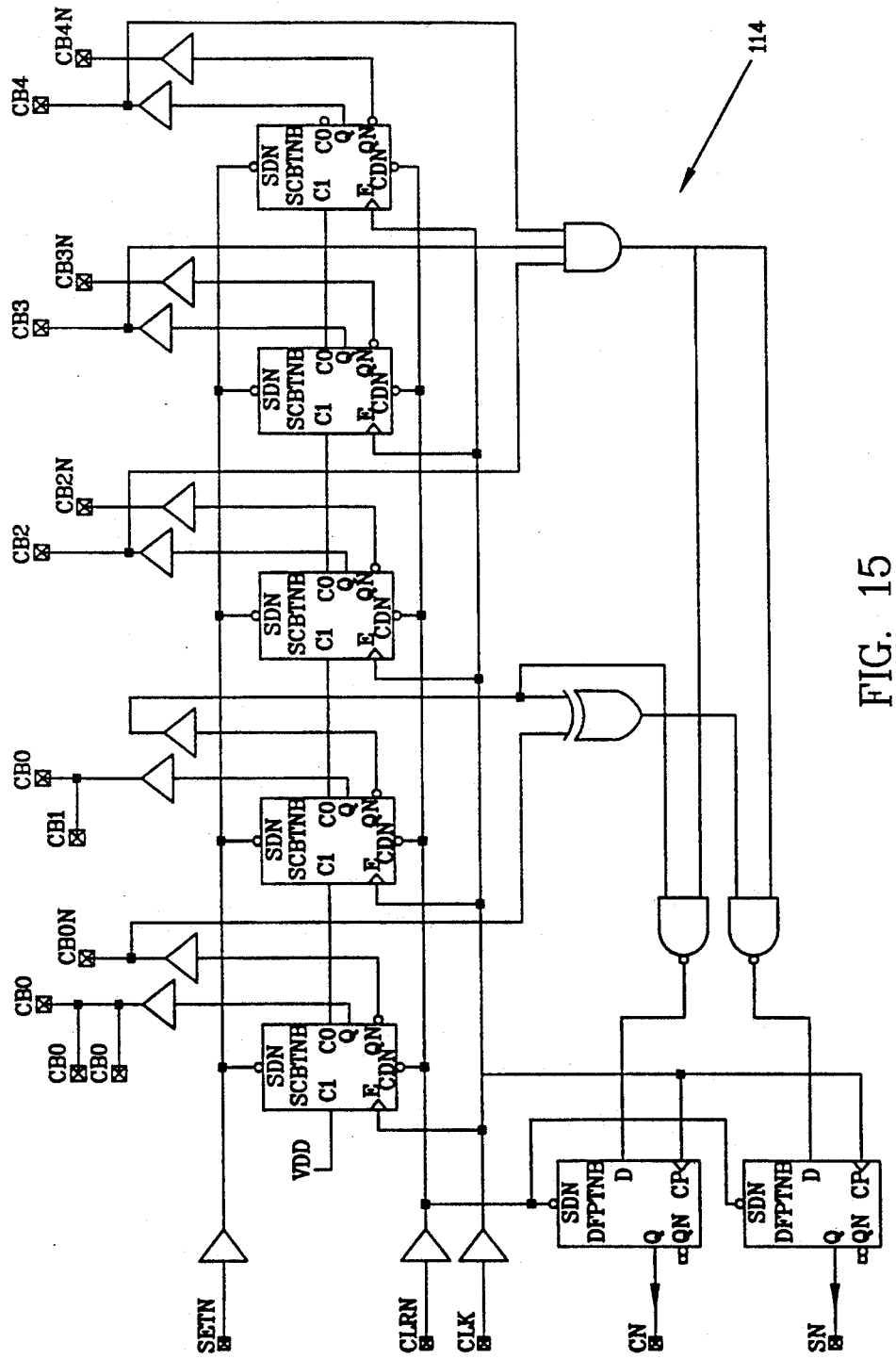

FIG. 15 is a schematic circuit diagram of counter 114 of FIG. 4.

Figure 16A:
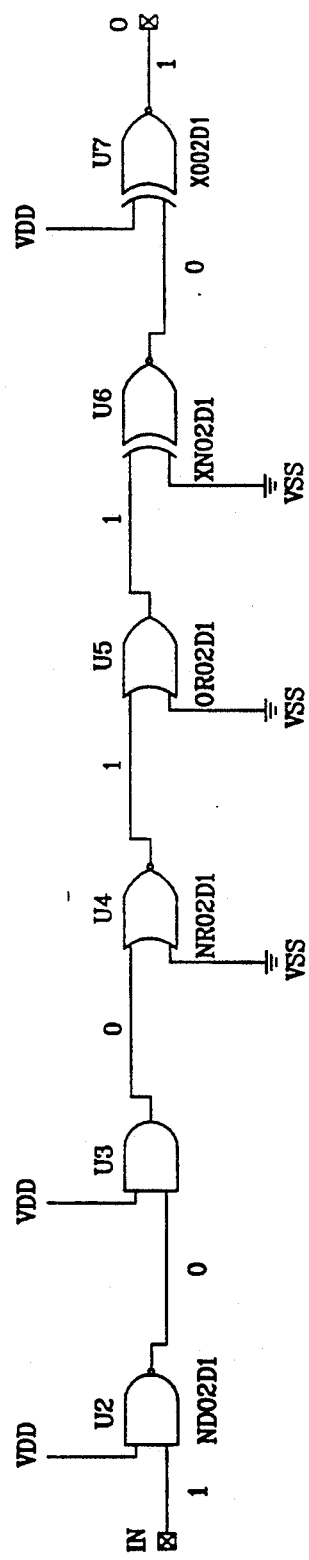

FIG. 16A is a schematic circuit diagram of a delay element.

Figure 16B:
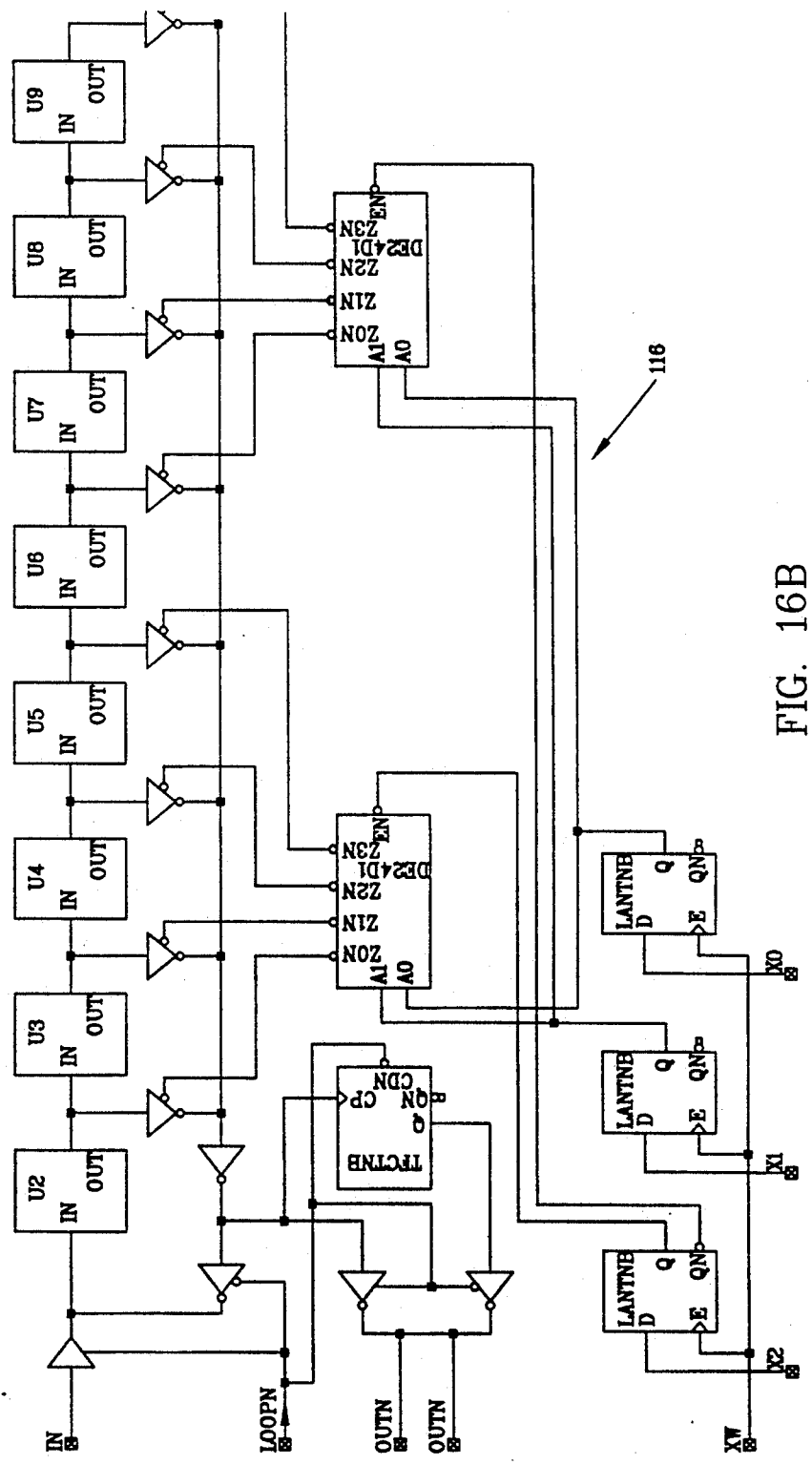

FIG. 16B is a block diagram of the ring oscillator 116 employing the delay element of FIG. 16A.

Figure 17:
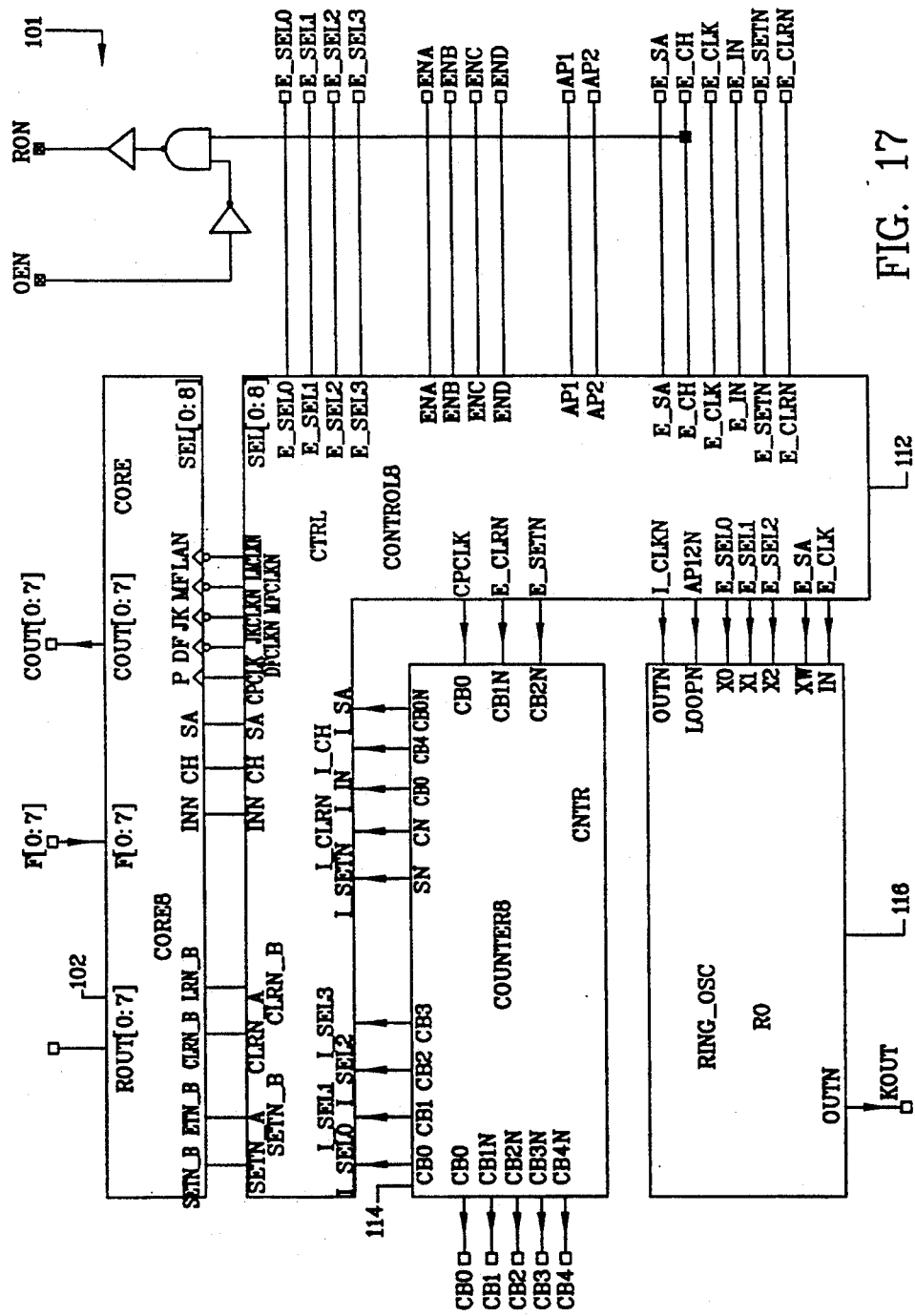

FIG. 17 is a block diagram illustrating the signals passing to and between the different blocks of FIG. 4.

DETAILED DESCRIPTION OF THE INVENTION

Figure 1:
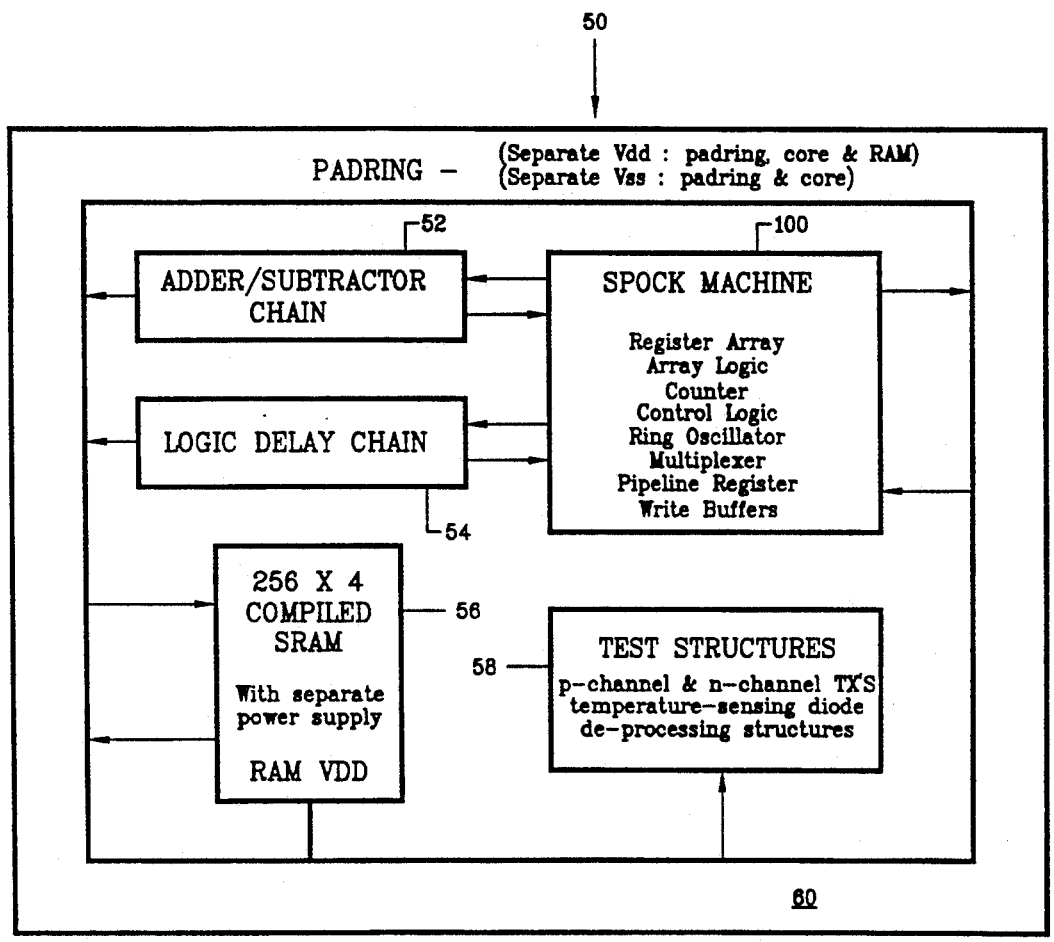
FIG. 1 is a block diagram of a standard-cell type reliability qualification vehicle to illustrate the invention.

As explained above, the design tools provided by VLSI Technology, Inc. includes two different approaches. In the standard-cell approach, the design of each cell in the library is optimized to reduce the area of semiconductor medium required and to optimize power and speed performance. FIG. 1 is a block diagram of a reliability qualification vehicle employing the standard-cell approach to illustrate the invention. As shown in FIG. 1, the standard-cell 50 includes an adder/subtractor chain 52, a logic delay chain 54, a SRAM 56, and test structures 58 as well as a core portion 100. The core portion includes most of the commonly used cells in circuit design. The core portion 100 is also included in the qualification vehicle in the gate-array approach illustrated in FIG. 2. The different cells 52, 54, 56, 58 and the cells in the core portion 100 are implemented in a semiconductor medium such as silicon which has therein a number of layers such as polysilicon, silicon oxide, n- or p-diffusion layers, metal layers or vias. Since each cell in the standard-cell approach is optimized to reduce the silicon area required and to improve power and speed performance, the layout of the layers of each cell is generally different from that of any other cell in the library. Therefore, when a customer tries to implement a given design using the standard-cell approach, much time will be required to lay out the different layers for the cells called for by the customer design and to interconnect portions of the layers through conductive paths such as through metal vias.

In the preliminary circuit design stage, a customer may simply be interested in the feasibility of a design, not so much coming up with the most economical design. In such circumstances, it may be desirable to adopt a second and different approach known as the gate-array approach. In such approach, the semiconductor medium such as silicon used for implementing the design also has layers therein. These layers usually include polysilicon, silicon oxide and the diffusion layers generally in the form of planar sheets distributed uniformly across the silicon wafer. The layout of the layers for one cell is exactly the same as that for a different cell in the gate-array cell library. What distinguishes one cell from a different cell are the metal interconnects that are used to connect different portions of the layers. Thus, in order to test the feasibility of a circuit design, all a circuit designer needs to do employing the gate-array approach is to lay out the metal interconnects. While the resulting design may not be the most economical, such an approach is faster and yields useful information for the circuit design process. After circuit design has proceeded to a certain stage, it may then be desirable to improve on the circuit layout by minimizing the silicon required and by maximizing speed and power performance. At such stage, it may be desirable to employ the standard-cell approach instead.

The vehicle employing the standard-cell approach is illustrated in FIG. 1. FIG. 1 is a block diagram of a reliability qualification vehicle 50 for qualifying ASIC cells implemented using the standard-cell approach. As shown in FIG. 1, vehicle 50 includes a core 100. Core 100 includes a register array, an array of logic gates, a counter, control logic, a ring oscillator, a multiplexer, pipeline registers, and write buffers—cells in a design library which are most frequently used by circuit designers. In addition, an adder/subtractor chain 52, a logic delay chain 54, and a SRAM 56 are included in vehicle 50. Core 100, chains 52, 54 and SRAM 56 are all implemented using the standard-cell approach. Since the layouts of the cells such as the chains 52, 54 and SRAM 56 are very different from the cells in core 100, these three additional components are added in vehicle 50 for reliability qualification of ASIC circuits designed using the standard-cell approach. These three components are included in vehicle 50 because they are used frequently enough so that testing of the layout of these designs is desirable.

Figure 2:
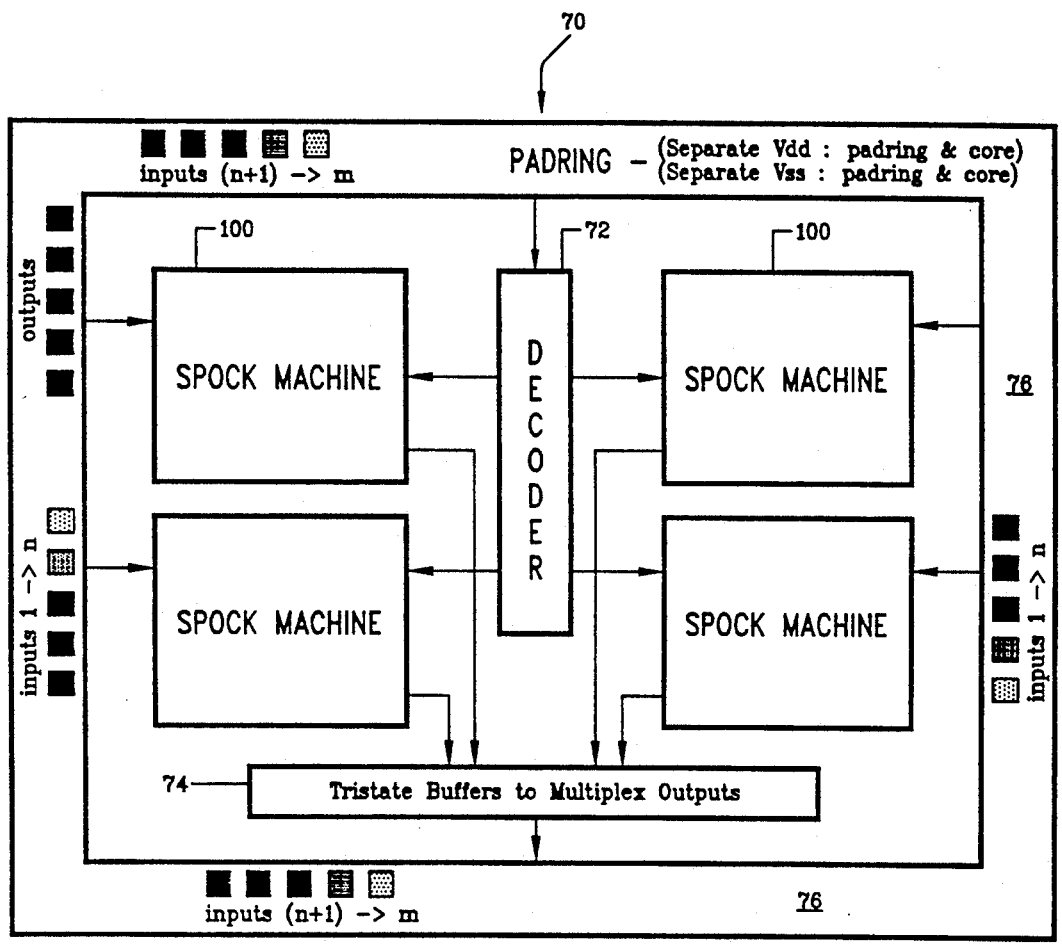
FIG. 2 is a block diagram of a gate-array type reliability qualification vehicle to illustrate the invention.

FIG. 2 is a block diagram of a reliability qualification circuit 70 employing the gate-array approach to illustrate the invention. As described in detail below, a reliability qualification vehicle employing the gate-array approach may include one or more circuits 70. As shown in FIG. 2, circuit 70 of FIG. 2 includes four cores 100 addressed through a decoder 72. The outputs of the four cores 100 are processed through a block 74 containing tri-state buffers and multiplexers. Pad ring 76 provides the input and output pads as well as power pads for operating circuit 70. An address signal is applied to circuit 70 from an external source and is decoded by decoder 72 to select the output of one of the four cores 100 for reading. The output of the particular core selected is then detected through one of the output pads connected to the tri-state buffer and multiplexer block 74. Block 74 permits the outputs of four cores 100 to be sequentially detected through one output pad and pin.

Different packaging processes for semiconductor chips may also affect the performance. For this reason it is desirable to determine the effects of various packaging processes. In particular, it is desirable to determine, for different size packages, whether the packaging process adversely affects the performance of the chip. For this reason, it is desirable to provide a reliability qualification vehicle which can be used for testing the performance of different sized chips packaged in different sized packages. This is illustrated in reference to FIGS. 2 and 3.

Figure 3:
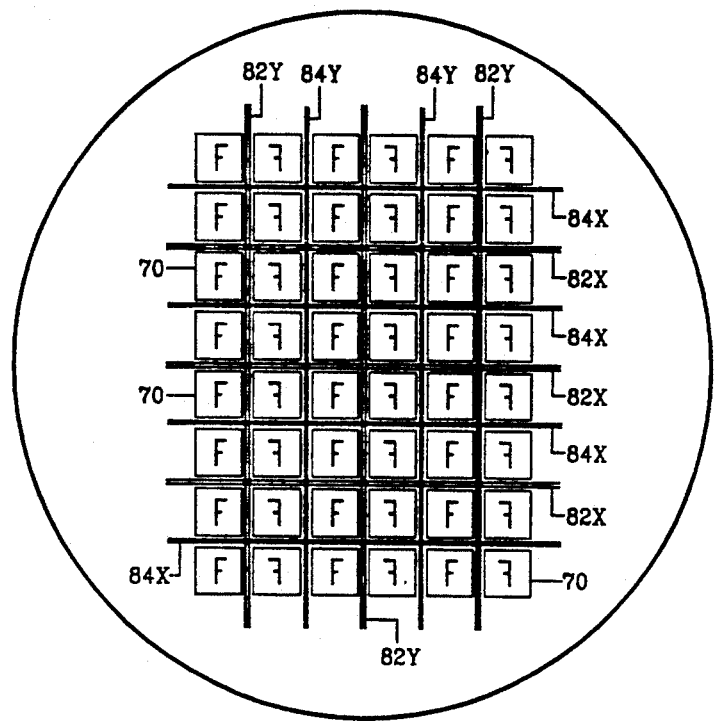
FIG. 3 is a schematic view of a portion of a semiconductor wafer to illustrate the construction of a gate-array type reliability qualification vehicle.

FIG. 3 is a schematic view of a semiconductor wafer in which is implemented as an array of gate-array type reliability qualification circuits 70. Wafer 80 may be cut along scribe lanes 82x, 82y, 84x, 84y to yield individual chips each packaged to become a reliability qualification vehicle which includes one or more circuits 70. The scribe lanes define dividing lines between circuits 70. Such chips may be packaged into a relatively small sized package in order to test the effect of such packaging on the vehicle. Alternatively, wafer 80 may be cut only along lines 84x, 84y to yield larger chips each containing four circuits 70. Yet another alternative is to cut wafer 80 along scribes 82x, 84y but only along 84y but not along 82y. This will yield chips each containing two circuits 70. These different sized chips may be packaged as a vehicle for the purpose of testing the reliability of different sized packages.

When wafer 80 is cut along all scribes 82x, 92y, 94x, 84y to yield chips each containing only one circuit 70, the padring 76 will appear along the four edges of the chip so that the input and output pads can be conveniently connected to the outside world. However, if wafer 80 is cut only along lines 82x, 82y to yield chips each containing four circuits 70, half of the padring of each of the four circuits will appear in internal locations away from the edges of the chip so that it is inconvenient and difficult to connect bonding wires from such pads to the outside world. The input and output pads on padring 76 of FIG. 2 are designed such that adequate input and output pads are provided even when wafer 80 is cut only along scribes 82x, 82y but not along scribes 84x, 84y.

As shown in FIG. 2, while all output pads are located on one side of the circuit 70 (left side as shown in FIG. 2), all input pads are duplicated on opposite sides of the circuit. Thus, if circuit 70 has four sides forming a quadrilateral, the output pads will appear on one side of the circuit whereas all input pads are duplicated on opposite sides of the circuit. As shown in FIG. 2, input pads 1 to n appear at or adjacent the left and right sides of the circuit while input pads (n+1) to m are located at or adjacent the top and bottom sides of the circuit. Therefore, as long as the side of circuit 70 where the output pads are located (i.e., left side) and another side of the circuit adjacent to such side (i.e., top or bottom side) are close to or at the edge of the chip, these two sides are adequate to provide the necessary input and output pads for the particular vehicle concerned. In other words, two adjacent sides of any circuit 70 will include a complete set of input pads for operating their circuit.

As shown in FIG. 3, adjacent circuits 70 on the same row (such as the row bounded by scribes 82x and 84x) are mirror images of one another. This is illustrated by the marking of the letter "F" on the circuits. In such manner, the output pads on the left side of the circuit shown in FIG. 2 of one circuit will appear instead on the right side of the adjacent circuit as a mirror image so that when the wafer 80 is cut along scribes 84x, 84y only, the output pads of both adjacent circuits will appear near the edge of the chip even if the chip contains four circuits 70 as described above. Thus the adjacent circuits form mirror images across a dividing line between the circuits.

FIG. 4 is a block diagram of core portion 100 illustrating some of the most frequently used cells in circuit design. Core 100 includes a shift register array 102, an array of logic gates 104 and multiplexer 106. Register array 102 may be loaded in series from control logic 112 or in parallel through write buffers 108. Each bit of the register array 102 and each of the outputs of the logic gates in array 104 may be read by means of multiplexer 106 and pipeline registers 110. Counter 114 and ring oscillator 116 provide internally generated control and clock signals for exercising arrays 102, 104, multiplexer 106, buffers 108, and registers 110.

In conventional designs, for reliability testing, frequently complex vectors of input signals are needed to maximize the number of nodes that can be tested. Such vectors require considerable time and expense to develop, and usually the percentage of nodes of a chip that can be exercised does not exceed 30% to 40%. In contrast, core 100 is capable of generating internal data, clock and control signals for exercising substantially all of the nodes in core 100. In conventional reliability testing, a vector of external signals are fed to a chip to be tested through the circuits of a burn in board. Because of the inherent inductance and capacitance of the circuitry associated with the burn in board, the chip to be tested usually cannot be operated at a frequency above 1 or 2 MHz. Since the normal operating frequency of many chips may be as high as 30 MHz, the conventional method of testing does not assure the reliability of the chip tested when operated at its normal operating frequency.

Core 100 is capable of generating its own internal clock signals at selectable frequencies within the range of approximately 1 to 30 MHz. Since the clock signal is internally generated, core 100 may be operated at such high frequencies without being limited by the inductance and capacitance of the circuitry of burn in boards. Thus core 100 may be tested at frequencies close to or at the operating frequencies of ASIC circuits to provide a much more accurate indication of circuit reliability. Before the generation of internal clock and control signals are considered in detail, the detailed structure of the register array 102, array logic 104 and multiplexer 106 will first be examined in some more detail.

FIG. 5 is a schematic circuit diagram of the register array 102, array logic 104 and multiplexer 106 of FIG. 4. As shown in FIG. 5, array 102 comprises an 8×8 array of flip-flops arranged in two banks (BANK4 ROW8) of four rows each: DFROW8, JKROW8, MFROW8 and LAROW8. DFROW8 comprises a row of 8 D flip-flops. Similarly, JKROW8 indicates a row of 8 JK flip-flops; MFROW8 indicates a row of 8 MF flip-flops; and LAROW8 indicates a row of 8 latch-type flip-flops. The structure of DFROW8 is illustrated in more detail in reference to FIG. 6A-6C. As shown in FIG. 6C, DFROW8 is a row of 4 DF1-type and 4 DF2-type flip-flops arranged as illustrated in FIG. 6C, where the DF1-, DF2-type flip-flops are illustrated in more detail in FIGS. 6A, 6B. Similarly, the other three rows of flip-flops are illustrated in reference to FIGS. 7A-7C, 8A-8C, 9A-9C. It will be noted that in the latch-type flip-flop in LAROW8 illustrated in FIGS. 8A, 8B, two latches are connected together in a manner so that they function essentially like a D-type flip-flop. As shown in FIGS. 9A-9C, the MF-type flip-flop has two possible inputs, DA, DB, one of which may be selected as the input by the select signal SA which is therefore a control signal for controlling array 102. All sixty-four flip-flops have set and clear terminals controlled by control signals (not shown in FIG. 5 for simplicity). Also not shown in FIG. 5 is how array 102 may be loaded in parallel through write buffer 108 of FIG. 4; FIG. 5 is used mainly to highlight how the output of each of the sixty-four flip-flops may be read through multiplexer 106.

FIG. 6A illustrates how flip-flop DF1 may be loaded either in series or in parallel. Thus when the select signal CH is high, the flip-flop is loaded in series by signal D; when the select signal CH is low, the flip-flop is loaded in parallel by the signal F. Thus the select signal CH controls the serial or parallel loading of array 102. As shown in FIG. 6C, it will be noted that all 8 D flip-flops may be loaded either serially by input signal IN or in parallel through terminals F by means of bus F[0;7] from write buffer 108 (FIG. 4). All sixty-four flip-flops may be loaded in parallel as shown in FIGS. 4, 6C, 7C, 8C, 9C and 10B.

As shown in FIG. 5, the QN output of each of the second, fourth, sixth and eighth flip-flop in each of the eight rows is applied to the succeeding flip-flop whereas the Q output of each of the first, third, fifth and seventh flip-flop in each of the eight rows is applied to the succeeding flip-flop so that when the input signal IN is a square wave, the outputs of the 64 flip-flops toggle between "0" and "1", thereby exercising all the flip-flops.

Each type of flip-flop may be operated by its own clock. Thus as shown in FIG. 10B, four different clocks DFCLKN, JKCLKN, MFCLKN, LACLKN are provided for operating the four different types of flip-flops in array 102. As noted in FIG. 10B, where desired, two different sets of set and clear signals (SETN-A, CLRN-A, SETN-B, CLRN-B) may be provided to set and clear the two different banks (BANK4ROW8) of array 102.

The logic array 104 (logic-block 8) will now be examined in reference to FIGS. 5, 11A-11C. As shown in FIGS. 5, 11C, array 104 comprises four NAND-gates and four NOR-gates where each gate receives as inputs four Q and four QN outputs of one row of flip-flops.

The multiplexer 106 (MUX8ROWS8) is illustrated in reference to FIGS. 5, 12A-12C. As shown in FIG. 5, multiplexer 106 comprises eight smaller multiplexers (MUX9) illustrated in more detail in FIG. 12A. MUX9 receives as inputs the outputs from the first column of flip-flops in array 102 as shown in FIG. 5; these inputs are labelled SENSE[0;7] in FIG. 12A. MUX9 receives in addition the output of one of the gates in array 104 as shown in FIG. 5. MUX9 then selects one of the nine signals as its output in response to four select signals SEL0-SEL3. As shown in FIG. 12A, control signal SEL3 selects between LOGSENSE (the output of one of the gates of array 104) and one of the signals SENSE[0;7] to be the output of MUX9. If the value of SEL3 is such that one of the signals SENSE[0;7] is selected, then the values of the select signals SEL0-SEL2 determine as to which of the eight flip-flops in the column whose output will be read as the output of MUX9.

In FIG. 5, the connections between the outputs of a column of a flip-flop and its corresponding MUX9 are shown only for the first and last MUX9, where the connections for the other six small multiplexers MUX9 have been mostly omitted except for the bottom portions of the connections to simplify the drawing. In such manner the output of each of the sixty-four flip-flops as well as the output of each of the eight gates in array 104 may be read by means of multiplexer 106 in response to the values of the four select signals SEL0-SEL3. FIGS. 12B, 12C illustrate in more detail the structure of MUX9 and the connections between the eight small multiplexers and the register array and array logic shown in FIG. 5. R0[0:7] through R7[0:7] are the outputs of the eight by eight register array 102. L[0:7] are the outputs of the array logic and OUT[0:7] are the eight outputs of the multiplexer 106 of FIG. 4, as illustrated in FIGS. 12B, 12C and 13.

As shown in FIG. 4, the output of multiplexer 106 is passed through pipeline register 110 and then appears as the output of core portion 100. As shown in FIGS. 1 and 2, the output of core portion 100 appears as the output of vehicles 50, 70. Therefore, a faulty flip-flop in array 102 or a faulty gate in array 104 or a faulty multiplexer in 106 will be relatively easy to trace in testing and analysis. Therefore, quick detection and feedback of faulty parts to the ASIC manufacturing groups is made possible by the above design for continually improving the quality and reliability of the ASIC technology.

The generation of the different control and clock signals will now be described in reference to FIGS. 14-17. An important feature of the reliability qualification vehicles of this invention is that the clock and control signals for exercising the vehicle may be generated internally so that no continuous external signals are required for exercising the vehicles. Thus in FIGS. 14-17, the control signals that originate externally are indicated by an "E" as the first letter of the signal. FIG. 14 is schematic circuit diagram of the control logic 112 of FIG. 4. Thus as shown in FIG. 14, E-SEL0 is an externally generated signal which, when selected, is used for the signal SEL0 shown in figures described above for controlling the multiplexer 106. Where the control signal originates internally, it is marked by an "I" as its first letter, also as shown in FIG. 14. The external signal AP1 selects between externally generated control signals and internally generated control signals for controlling register array 102, array logic 104, multiplexer 106, write buffer 108 and pipeline registers 110. In other words, when AP1 is high, the internal control signals are selected for controlling the core portion 100 over the external control signals or vice versa. In the same vein, the externally generated signal AP2 selects between the internally generated clock signal and externally generated clock signal for operating the above-named devices, as illustrated in FIG. 14.

The internally generated control signals are provided by counter 114 of FIGS. 4, 15. As will be appreciated from the logic design of the counter in FIG. 15, counter 114 is a five-bit counter which counts from 0 to 31 cycles. The counter generates the SET signal SN and CLEAR signal CN shown in FIG. 15 for controlling the register array. During the twenty-ninth cycle, the SET signal will be active for setting array 102. During the thirtieth cycle, both the SET an CLEAR signals will be active for setting and clearing array 102 and during the thirty-first cycle, the CLEAR signal will be active for clearing array 102. As shown in FIGS. 15 and 17, counter 114 also generates outputs CB0-CB3 to be the internally generated select signals I-SEL0, I-SEL1, I-SEL2, and I-SEL3 signals. The signals CBO, CB4 may also be used as the internally generated square wave data (IN), serial/parallel loading select (CH), and select (SA) signals as shown in FIG. 17. Thus all the required control signals can be generated internally by counter 114 so that no continuous external control signals are required for exercising core 100.

Oscillator 116 is illustrated in reference to FIGS. 16A, 16B, 17. As shown in FIGS. 16A, 16B, oscillator 116 comprises a string of eight delay elements (labelled RO-ELEMENT) in FIG. 16A, 16B. As shown in FIG. 16A, a RO-ELEMENT comprises six inverters of different logic design. As shown in FIG. 16B, feedback paths are provided at the output of each RO-ELEMENT, where at most one of the feedback paths will be enabled at any one time. The frequency of oscillator 116 may be selected by enabling the appropriate feedback path. Thus if the feedback path connected to the output of the RO-ELEMENT U2 (FIG. 16B) is enabled, oscillator 116 will provide a clock signal at the highest possible frequency. If instead the feedback path connected to the output of RO-ELEMENT U3 is enabled, the frequency of oscillator 116 will be reduced by a factor of 2. It will be noted that in each feedback path three inverters are provided so that the output OUTN will toggle between high and low to provide an internally generated clock signal. In such manner, an internally generated clock signal may be generated with a frequency selectable between eight possible frequencies. The selection of the appropriate frequency is controlled by inputs X0-X2. From FIG. 17, it will be observed that these inputs X0-X2 from an external source may simply be the signals E-SEL0 through E-SEL2 since these select signals will not be used for control purposes when core 100 is operated by means of internally generated clock signals. As shown in FIGS. 14, 16B, 17, the signal AP12N from control logic 112 may be used to disable (through input LOOPN in FIG. 16B) all the feedback paths of oscillator 116. In such event, oscillator 116 is transformed into a delay chain. This happens when both signals AP1, AP2 select externally generated clock and control signals for operating core 100. The input signal IN may also be generated internally instead of externally. As shown in FIG. 17, the internally generated input signal I-IN may simply be the signal CB0 from counter 114.

From the above, it will be evident that the purpose of the vehicles is achieved. With the above design, substantially all the gates of the vehicle are testable. Furthermore, the vehicles represent typical customer designs in terms of number and types of design library cells utilized, typological complexity (especially interconnect routing), design tools used, power dissipation, and maximum operating frequency. In many customer designs, the circuit is operated synchronously. In the above illustration of the invention, core 100 is operated synchronously and vehicles 50, 70 may be operated in such manner as well. While the invention is described with the aid of particular embodiments, it will be understood that various modifications may be made without departing from the scope of the invention. For example, the specific number of flip-flops in array 102 and the number of gates 104 or the number of multiplexer 106 may be altered without departing from the scope of the invention. Similarly, the internally generated clock signal may be selected from less than or more than eight frequencies. Depending on the fabrication process and the design of the oscillator 116 (e.g. the number of delay elements in each stage), the frequencies of the internally generated clock may be varied beyond 30 MHz to values approaching 100 MHz. The internally generated control signals may also be generated in a manner different from that described above. The vehicle may also be operated asynchronously as well. All such variations are within the scope of the invention which is to be limited only by the dependent claims.

What is claimed is:

1. A reliability qualification vehicle for use with an application specific integrated circuit design system, said system including a design library of a plurality of cells and a place and route scheme providing different cell designs and cell interconnection routes to enable a plurality of different integrated circuits to be designed from said cells using said place and route scheme, said vehicle comprising a first integrated circuit employing from said library at least some cells that are representative of the plurality of cells in the library, and using said place and route scheme, such that said cells in said first integrated circuit are designed and interconnected in a manner representative of a predetermined number of said plurality of integrated circuits so that reliability testing of said first integrated circuits will indicate the reliability of other integrated circuits designed using at least some of said cells and employing said place and route scheme, wherein said scheme employs gate arrays so that said first circuit is implemented in gate arrays in a semiconductor medium having a plurality of different layers so that said different layers are substantially uniform throughout the medium, wherein said layers are substantially planar sheets, said first circuit comprising portions of said layers and conductive paths connecting at least some of the portions, said vehicle further comprising a second circuit adjacent to the first circuit and substantially the same as the first circuit such that the two circuits are substantially mirror images across a dividing line between the two circuits, each of the first and second circuits having output pads on a side of such circuit away from the dividing line, so that when the medium is cut along locations adjacent to the output pads to form a chip having the two circuits, or cut, in addition to said locations, along locations between the circuits to form two chips each having one circuit, the output pads of the circuits will be located at or near the edge(s) of the chip(s).

2. The vehicle of claim 1, wherein each of the two circuits has four sides, input pads on each of the four sides and output pads on one of the four sides.

3. The vehicle of claim 2, wherein the four sides of each circuit form two pairs of two opposite sides in each pair, and wherein any input pad to each circuit on one side of such circuit is duplicated on the opposite side so that the input pads on any two adjacent sides of a circuit form a complete set of input pads required for operating the circuit, and so that irrespective of whether the medium is cut into a chip containing one circuit or a chip containing two circuits, each circuit on the chip has a complete set of input pads at or near edges of the chip.

4. The vehicle of claim 3, said vehicle further comprising a third and a fourth circuit that are adjacent to and are substantially mirror images of the first and second circuits across a second dividing line located between the first and second circuits on one side and the third and fourth circuits on the other, wherein the four sides of each circuit form a quadrilateral, and wherein any two adjacent sides of each circuit contain all the input pads required for operating such circuit, so that irrespective of whether the medium is cut into chips each containing one circuit or into chips each containing two circuits or a chip containing four circuits, each circuit on the chip has a complete set of input pads at or adjacent to edges of the chip or chips.

* * * * *